United States Patent [19]

Hirano

[11] Patent Number: 5,608,804

[45] Date of Patent: Mar. 4, 1997

[54] METHOD OF AND APPARATUS FOR IDENTIFYING A SYSTEM WITH ADAPTIVE FILTER

[75] Inventor: Akihiro Hirano, Tokyo, Japan

[73] Assignee: NEC Corporation, Tokyo, Japan

[21] Appl. No.: 365,003

[22] Filed: Dec. 28, 1994

[30] Foreign Application Priority Data

Dec. 28, 1993 [JP] Japan .................................. 5-334106

[51] Int. Cl.[6] .............................. A61F 11/06; H03B 29/00
[52] U.S. Cl. .............................. 381/71; 381/94; 379/410; 379/411; 364/724.19
[58] Field of Search ............................ 364/724.19, 724.2, 364/724.16; 381/71, 94; 379/410, 411, 412

[56] References Cited

U.S. PATENT DOCUMENTS 4,939,685  7/1990  Feintuch .............................. 364/724.19
5,475,632  12/1995  Sugiyama ............................ 364/724.19

FOREIGN PATENT DOCUMENTS 2-288428  11/1990  Japan .

OTHER PUBLICATIONS

Widrow et al., "Adaptive Noise Cancelling: Principles and Applications", Proceedings of the IEEE, vol. 63, No. 12, Dec. 1975, pp. 1692–1716.

Nagumo et al., "A Learning Method for System Identification", IEEE Transactions on Automatic Control., vol. AC–12, No. 3, Jun. 1967, pp. 282–286.

Fukumoto et al., "Effects of Interrupting Coefficients Update on Learning Identification Method", Proceedings of the 1994 OIEICE Spring Conference vol. 1, p. 246.

*Primary Examiner*—Curtis Kuntz
*Assistant Examiner*—Duc Nguyen
*Attorney, Agent, or Firm*—Foley & Lardner

[57] ABSTRACT

A method of and an apparatus for identifying a system which allow a filter coefficient to be updated accurately even if noise is mixed. The apparatus for identifying a system includes an adaptive filter for processing a reference input signal to produce an output signal, a subtractor for subtracting the output signal of the adaptive filter from an observed signal, a power estimating circuit for estimating the power of the reference input signal, and a step size determining circuit for determining a step size based on the estimated power of the reference input signal. The step size determining circuit generates a step size according to a function of the power of the reference input signal which monotonously increases if the power of the reference input signal is smaller than a threshold and monotonously decreases if the power of the reference input signal is greater than the threshold.

50 Claims, 19 Drawing Sheets

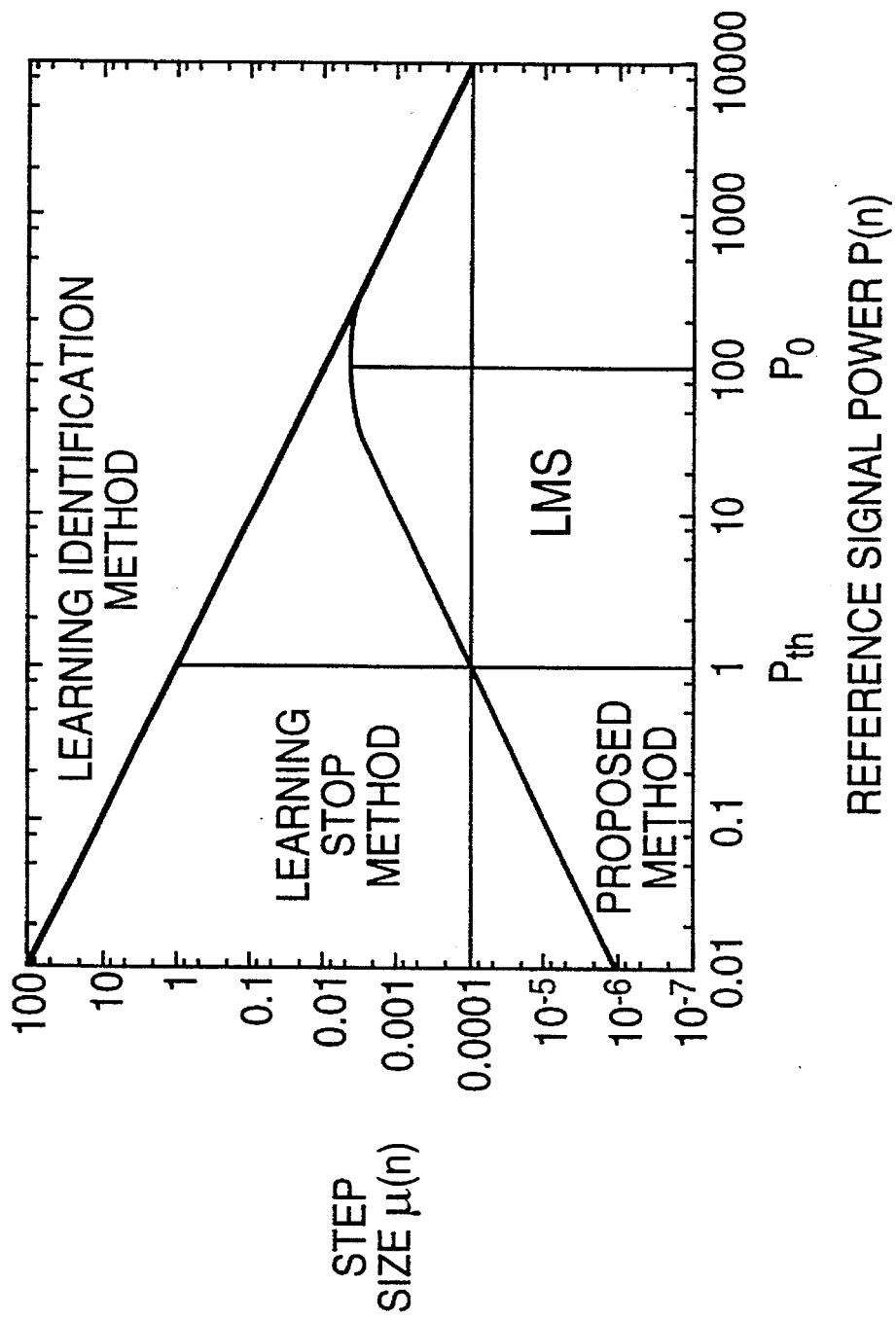

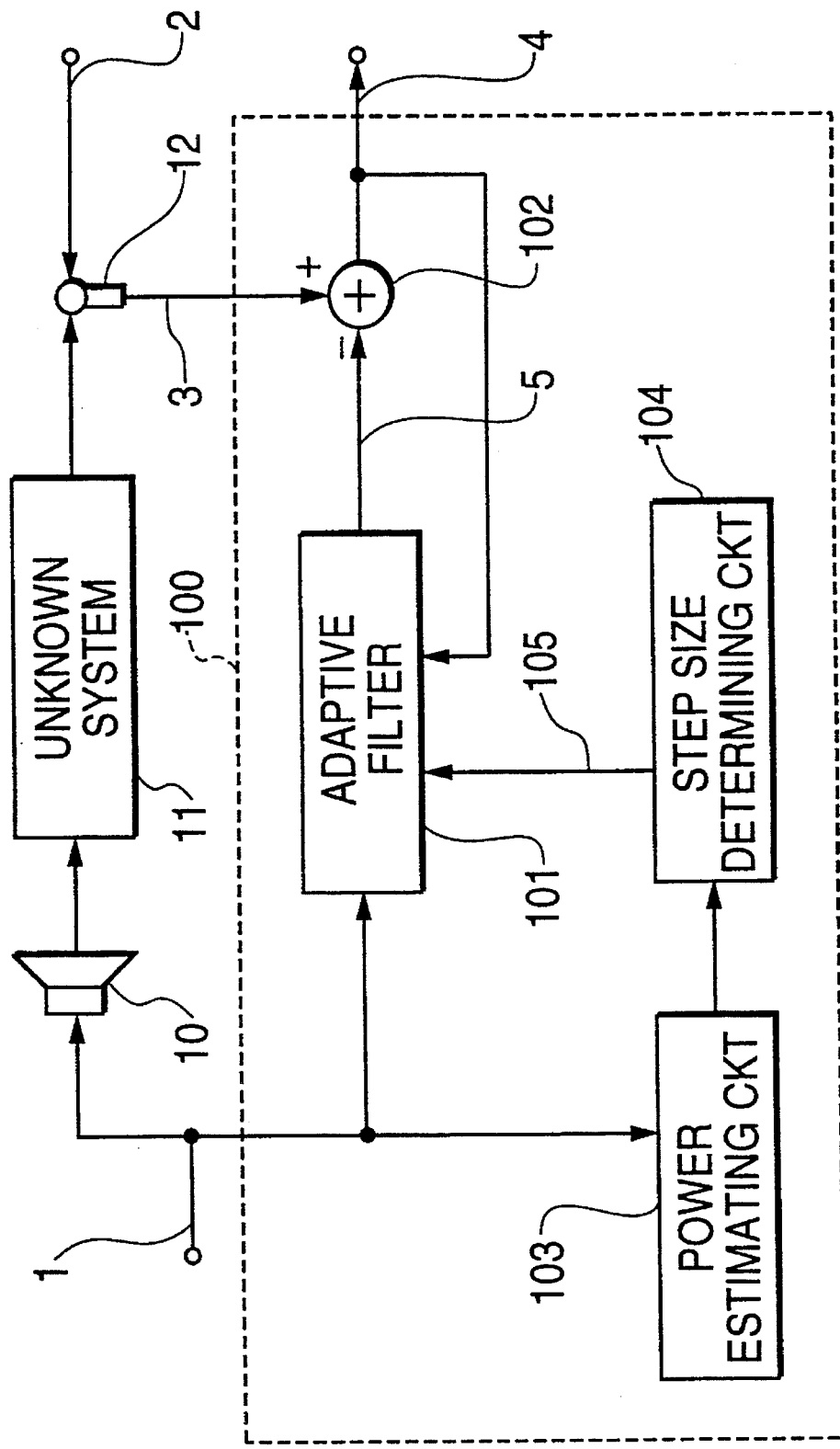

METHOD OF AND APPARATUS FOR IDENTIFYING A SYSTEM WITH ADAPTIVE FILTER

BACKGROUND OF THE INVENTION

1. Field of the Invention

The present invention relates to a method of and an apparatus for estimating characteristics of an unknown system using an adaptive filter in an echo canceller active noise control, equalizer, line enhancer, adaptive array, adaptive loudspeaker or a noise canceller.

2. Description of the Related Art

Transversal adaptive filters based on the learning identification method described in IEEE transactions on automatic control, Vol. AC-12, No. 3, pp. 282–287, 1967, USA (hereinafter referred to as Literature 1) are widely used in methods of and apparatus for estimating characteristics of an unknown system. The principles of operation of an acoustic echo canceller incorporating a transversal adaptive filter based on the learning identification method will be described below.

FIG. 1 of the accompanying drawings is a block diagram of an acoustic echo canceller based on the learning identification method. A system identification device is used as an echo canceller 100. A reference input signal 1 is converted by a loudspeaker 10 into an acoustic signal which is propagated through an acoustic path 11 as an unknown system and reaches, as an acoustic echo, a microphone 12. The microphone 12 converts the acoustic echo, with noise 2 added thereto, into an electric signal as an observed signal 3. An adaptive filter 101 effects a convolutional calculation on the reference input signal 1 and filter coefficients, and supplies the result as an output signal 5 to a subtractor 102. The subtractor 102 subtracts the output signal 5 from the observed signal 3, and produces a resultant error signal 4 as an output signal from the echo canceller 100, which is supplied to the adaptive filter 101. A power estimating circuit 103 estimates the power of the reference input signal 1, and supplies the estimated power to a divider 115. The divider 115 divides a positive constant $\mu_0$ stored in a register 114 by the estimated power, and outputs the quotient as a step size 105. The adaptive filter 101 updates the filter coefficients in order to minimize the error signal 4, using the step size 105 supplied from the divider 115, the reference input signal 1, and the error signal 4.

The above process is expressed by equations as follows: It is assumed that the unknown system has an impulse response $h_i$ ($i=0, \ldots, N-1$), the reference input signal 1 at a time "t" is represented by $x(t)$, the noise 2 at the time "t" by $n(t)$, and the observed signal 3 at the time "t" by $d(t)$. The relationship between the reference input signal $x(t)$, the noise $n(t)$, and the observed signal $d(t)$ is given by:

$$d(t) = \sum_{i=0}^{N-1} h_i x(t-i) + n(t) \tag{1}$$

If the adaptive filter 101 has a tap number N and the filter coefficient is represented by $w_i(t)$ ($i=0, \ldots, N-1$), then the adaptive filter 101 produces an output signal $y(t)$ expressed by:

$$y(t) = \sum_{i=0}^{N-1} w_i(t) x(t-i) \tag{2}$$

From the equations (1) and (2), the error signal $e(t)$ is indicated by:

$$\begin{aligned} e(t) &= d(t) - y(t) \\ &= \sum_{i=0}^{N-1} \{h_i - w_i(t)\} x(t-i) + n(t) \end{aligned} \tag{3}$$

Using the step size $\mu(t)$, the filter coefficient $w_i(t)$ is updated as follows:

$$w_i(t+1) = w_i(t) + \mu(t) e(t) x(t-i) \tag{4}$$

The step size $\mu(t)$ is given by:

$$\mu(t) = \frac{\mu_0}{p_x(t)} \tag{5}$$

where $p_x(t)$ is the power of the reference input signal 1 which is determined by the equation:

$$p_x(t) = \sum_{i=0}^{N-1} x^2(t-i) \tag{6}$$

and $\mu_0$ is a constant in the range of:

$$0 < \mu_0 < 2 \tag{7}$$

The learning identification method updates the filter coefficient using the error signal $e(t)$.

It can be seen from the equation (3) that the error signal $e(t)$ contains the noise $n(t)$ in addition to the system identification error $h_i - w_i(t)$. When the noise $n(t)$ is sufficiently smaller than the output signal of the unknown system, the filter coefficient can be updated properly and the characteristics of the unknown system can be identified according to the learning identification method. However, when the noise $n(t)$ is larger, the filter coefficient cannot be corrected properly.

Furthermore, if the reference input signal $x(t)$ is a non-stationary signal such as a speech signal, then the filter coefficient may not be updated properly even when the noise $n(t)$ is relatively small. The reasons for this are considered to be as follows: Since the step size $\mu(t)$ is inversely proportional to the power $P_x(t)$ of the reference input signal $x(t)$, the step size $\mu(t)$ is very large if the reference input signal $x(t)$ is very small. The output signal from the unknown system 11 is very small, and the error signal $e(t)$ contains larger noise $n(t)$. Therefore, the filter coefficient $w_i(t)$ is updated greatly using the noise $n(t)$ rather than the identification error $h_i - w_i(t)$ with respect to the unknown system. As a result, the filter coefficients cannot be updated corrected properly.

As described above with reference to FIG. 1, the adaptive filter based on the learning identification method cannot update the filter coefficient properly when the noise is large.

SUMMARY OF THE INVENTION

It is therefore an object of the present invention to provide a method of and an apparatus for identifying an unknown system using an adaptive filter which can update the filter coefficient properly even in an environment in which noise is large.

To achieve the above object of the present invention, there is provided a first method of identifying a system with an adaptive filter, comprising the steps of calculating an error signal by subtracting an output signal produced by processing a reference input signal with an adaptive filter from an observed signal composed of a mixture of an output signal from an unknown system and noise, estimating characteristics of the unknown system by correcting coefficients of the adaptive filter in order to minimize the error signal using at least the error signal, the reference input signal, and a step size, and producing a value as the step size by estimating the power of the reference input signal and processing the estimated power of the reference input signal according to a function which has a maximum value when the power of the reference input signal is equal to a first threshold, monotonously increases when the power of the reference input signal is smaller than the first threshold, and monotonously decreases when the power of the reference input signal is greater than the first threshold.

As a second means of achieving the object of the present invention, the first method further comprises the steps of estimating the level of noise mixed in the observed signal using the error signal and at least one of an output signal from the adaptive filter and the reference input signal, and controlling the first threshold depending on the level of noise, thereby determining the first threshold.

As a third means of achieving the object of the present invention, the first method further comprises the steps of estimating the level of noise mixed in the observed signal using the error signal and at least one of an output signal from the adaptive filter and the reference input signal, estimating the gain of the unknown system using the coefficient of the adaptive filter, and controlling the first threshold depending on the level of noise and the gain of the unknown system, thereby determining the first threshold.

As a fourth means of achieving the object of the present invention, the first method further comprises the steps of estimating the level of noise mixed in the observed signal using the error signal and at least one of an output signal from the adaptive filter and the reference input signal, and controlling the first threshold and a maximum value of the step size depending on the level of noise, thereby determining the first threshold and the maximum value of the step size.

As a fifth means of achieving the object of the present invention, the first method further comprises the steps of estimating the level of noise mixed in the observed signal using the error signal and at least one of an output signal from the adaptive filter and the reference input signal, estimating the gain of the unknown system using the coefficient of the adaptive filter, and controlling the first threshold and a maximum value of the step size depending on the level of noise and the gain of the unknown system, thereby determining the first threshold and the maximum value of the step size.

As a sixth means of achieving the object of the present invention, the methods of each of the second, third, fourth, and fifth means further comprise the steps of updating an estimated value of the level of noise only when the output signal from the adaptive filter has a level smaller than a second threshold, and otherwise holding a preceding estimated value of the level of noise, thereby estimating the level of noise.

As a seventh means of achieving the object of the present invention, the sixth method further comprises the step of controlling the second threshold depending on the level of the error signal, thereby estimating the level of noise.

As an eighth means of achieving the object of the present invention, the method of each of the second, third, fourth, and fifth inventions further comprise the steps of updating an estimated value of the level of noise only when the reference input signal has a level smaller than a third threshold, and otherwise holding a preceding estimated value of the level of noise, thereby estimating the level of noise.

As a ninth means of achieving the object of the present invention, the eighth method further comprises the step of controlling the third threshold depending on the level of the error signal, thereby estimating the level of noise.

As a tenth means of achieving the object of the present invention, the method of each of the second, third, fourth, and fifth inventions further comprise the steps of adding the product of an estimated value of the level of noise and a first coefficient and the product of the level of the error signal and a second coefficient thereby to produce a new estimated value of the level of noise, and controlling the first coefficient and the second coefficient depending on the level of the error signal and the level of at least one of the output signal from the adaptive filter and the reference input signal, thereby estimating the level of noise.

As an eleventh means of achieving the object of the present invention, there is provided an apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of the adaptive filter based on the error signal, comprising an adaptive filter for producing an output signal using at least the reference input signal and a filter coefficient thereof, a subtractor for calculating an error signal by subtracting the output signal of the adaptive filter from an observed signal composed of a mixture of an output signal from the unknown system and noise, and supplying the error signal to the adaptive filter, a power estimating circuit for estimating the power of the reference input signal, and a step size determining circuit for calculating a step size based on the estimated power from the power estimating circuit and supplying the calculated step size to the adaptive filter, the arrangement being such that the step size determining circuit generates a step size according to a function of the power of the reference input signal which monotonously increases if the power of the reference input signal is smaller than a first threshold and monotonously decreases if the power of the reference input signal is greater than the first threshold, and the adaptive filter corrects the filter coefficient thereof in order to minimize the error signal using at least the error signal, the reference input signal, and the step size, for thereby estimating the characteristics of the unknown system.

As a twelfth means of achieving the object of the present invention, there is provided an apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of the adaptive filter based on the error signal, comprising an adaptive filter for producing an output signal using at least the reference input signal and filter coefficients thereof, a subtractor for calculating an error signal by subtracting the output signal of the adaptive filter from an observed signal composed of a mixture of an output signal from the unknown system and noise, and supplying the error signal to the adaptive filter, a power estimating circuit for estimating the power of the reference input signal, a noise level estimating circuit for estimating the level of noise mixed in the observed signal using the error signal and at least one of the output signal from the adaptive filter and the reference input signal, a threshold setting circuit for calculating a first threshold based on the estimated level of noise from the noise level estimating circuit, and a step size determining circuit for calculating a step size based on the estimated power from the power estimating circuit and the first threshold from the threshold setting circuit, and supplying the calculated step size to the adaptive filter, the arrangement being such that the step size determining circuit generates a step size according to a function of the power of the reference input signal which monotonously increases if the power of the reference input signal is smaller than the first threshold and monotonously decreases if the power of the reference input signal is greater than the first threshold, and the adaptive filter corrects the filter coefficients thereof in order to minimize the error signal using at least the error signal, the reference input signal, and the step size, for thereby estimating the characteristics of the unknown system.

As a thirteenth means of achieving the object of the present invention, there is provided an apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of the adaptive filter based on the error signal, comprising an adaptive filter for producing an output signal using at least the reference input signal and the filter coefficients thereof, a subtractor for calculating an error signal by subtracting the output signal of the adaptive filter from an observed signal composed of a mixture of an output signal from the unknown system and noise, and supplying the error signal to the adaptive filter, a power estimating circuit for estimating the power of the reference input signal, a noise level estimating circuit for estimating the level of noise mixed in the observed signal using the error signal and at least one of the output signal from the adaptive filter and the reference input signal, a gain calculating circuit for estimating the gain of the unknown system using the filter coefficients of the adaptive filter, a threshold setting circuit for calculating a first threshold based on the estimated level of noise from the noise level estimating circuit and the estimated gain from the gain calculating circuit, and a step size determining circuit for calculating a step size based on the estimated power from the power estimating circuit and the first threshold from the threshold setting circuit, and supplying the calculated step size to the adaptive filter, the arrangement being such that the step size determining circuit generates a step size according to a function of the power of the reference input signal which monotonously increases if the power of the reference input signal is smaller than the first threshold and monotonously decreases if the power of the reference input signal is greater than the first threshold, and the adaptive filter corrects the filter coefficients thereof in order to minimize the error signal using at least the error signal, the reference input signal, and the step size, for thereby estimating the characteristics of the unknown system.

As a fourteenth means of achieving the object of the present invention, there is provided an apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of the adaptive filter based on the error signal, comprising an adaptive filter for producing an output signal using at least the reference input signal and the filter coefficients thereof, a subtractor for calculating an error signal by subtracting the output signal of the adaptive filter from an observed signal composed of a mixture of an output signal from the unknown system and noise, and supplying the error signal to the adaptive filter, a power estimating circuit for estimating the power of the reference input signal, a noise level estimating circuit for estimating the level of noise mixed in the observed signal using the error signal and at least one of the output signal from the adaptive filter and the reference input signal, and a step size determining circuit for calculating a step size based on the estimated power from the power estimating circuit and the estimated level of noise from the noise level estimating circuit, and supplying the calculated step size to the adaptive filter, the arrangement being such that the step size determining circuit establishes a first threshold and a maximum value of the step size based on the estimated level of noise, generates a step size according to a function of the power of the reference input signal which monotonously increases if the power of the reference input signal is smaller than the first threshold and monotonously decreases if the power of the reference input signal is greater than the first threshold, and the adaptive filter corrects the filter coefficients thereof in order to minimize the error signal using at least the error signal, the reference input signal, and the step size, for thereby estimating the characteristics of the unknown system.

As a fifteenth means of achieving the object of the present invention, there is provided an apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of the adaptive filter based on the error signal, comprising an adaptive filter for producing an output signal using at least the reference input signal and the filter coefficients thereof, a subtractor for calculating an error signal by subtracting the output signal of the adaptive filter from an observed signal composed of a mixture of an output signal from the unknown system and noise, and supplying the error signal to the adaptive filter, a power estimating circuit for estimating the power of the reference input signal, a noise level estimating circuit for estimating the level of noise mixed in the observed signal using the error signal and at least one of the output signal from the adaptive filter and the reference input signal, a gain calculating circuit for estimating the gain of the unknown system using the filter coefficients of the adaptive filter, and a step size determining circuit for calculating a step size based on the estimated power from the power estimating circuit, the estimated level of noise from the noise level estimating circuit, and the estimated gain from the gain estimating circuit, and supplying the calculated step size to the adaptive filter, the arrangement being such that the step size determining circuit establishes a first threshold and a maximum value of the step size based on the estimated level of noise and the estimated gain of the unknown system, generates a step size according to a function of the power of the reference input signal which monotonously increases if the power of the reference input signal is smaller than the first threshold and monotonously decreases if the power of the reference input signal is greater than the first threshold, and the adaptive filter corrects the filter coefficients thereof in order to minimize the error signal using at least the error signal, the reference input signal, and the step size, for thereby estimating the characteristics of the unknown system.

As a sixteenth means of achieving the object of the present invention, the noise level estimating circuit in the apparatus according to each of the twelfth, thirteenth, fourteenth, and fifteenth inventions comprise an output level estimating circuit for estimating the level of the output signal from the adaptive filter, a register for storing a second threshold, a comparator for comparing the estimated level of the output signal from the adaptive filter with the second threshold, and a noise level calculating circuit for updating the estimated level of noise using the error signal only if the comparator determines that the estimated level of the output signal from the adaptive filter is smaller than the second threshold.

As a seventeenth means of achieving the object of the present invention, the register in the apparatus according to the sixteenth invention is replaced with a threshold generator for generating a threshold depending on the error signal which is supplied as an input signal thereto.

As an eighteenth means of achieving the object of the present invention, the output level estimating circuit in the apparatus according to the sixteenth invention is replaced with a reference input signal level estimating circuit for estimating the level of the reference input signal, and the register stores the second threshold.

As a nineteenth means of achieving the object of the present invention, the register in the apparatus according to the eighteenth invention is replaced with a threshold generator for generating a threshold depending on the error signal which is supplied as an input signal thereto.

As a twentieth means of achieving the object of the present invention, the noise level estimating circuit in the apparatus according to each of the twelfth, thirteenth, fourteenth, and fifteenth inventions comprise a register for storing the estimated level of noise, a first multiplier for multiplying the estimated level of noise stored in the register by a first coefficient, a nonlinear converter for nonlinearly converting the error signal into a converted signal, a second multiplier for multiplying the converted signal by a second coefficient, an adder for adding a product signal from the first multiplier and a product signal from the second multiplier, and storing a resultant sum signal in the register as the estimated level of noise, and a coefficient generator for establishing the first and second coefficients based on the error signal and at least one of the result of the output signal from the adaptive filter and the reference signal.

With the method of and apparatus for identifying a system according to the present invention, the filter coefficients can be updated properly even in an environment in which noise is large, by reducing the step size when the power of the reference input signal is small. Since a parameter is varied depending on the noise level and the gain of the unknown system, the method of and apparatus for identifying a system according to the present invention can keep up with variations in the noise level and the gain of the unknown system.

Relationship to the Prior Art (1) Literature Titles:

Literature 1: Widrow, et. al., "Adaptive Noise Cancelling: Principles and Application," Proceedings of the IEEE, Vol. 63, No. 12, pp.1692–1716, 1975, USA Literature 2: Nagumo and Noda, "A Learning Method for System Identification," IEEE transactions on automatic control, Vol. AC-12, No. 3, 1967, USA Literature 3: Sakai and Amano, "Echo Canceller Control System," Japanese laid-open patent publication No. 02-288428, November 1990

Literature 4: Fukumoto, et al., "Effects of Interrupting of Coefficients Update in Learning Identification Method," Proceedings of the 1994 IEICE Spring Conference, Vol. 1, pp. 246.

(2) Differences in Arrangement:

The present invention is concerned with varying the coefficient updating quantity of a stochastic gradient algorithm depending on the reference signal power, and differs from the prior art with respect to a process of varying the coefficient updating quantity. Known algorithms of this type include an LMS algorithm (Literature 2), a learning identification method (Literature 1), and a adaptation stop method (Literature 3, 4).

FIG. 2 shows the relationship between the coefficient updating quantity and the reference signal power of each of the methods. The coefficient updating quantity of the LMS algorithm is constant irrespective of the reference signal power. In the learning identification method, the coefficient updating quantity is inversely proportional to the reference signal power. In the adaptation stop method, the coefficient updating quantity is 0 if the reference signal power is smaller than a certain threshold, and is in inverse proportion to the reference signal power if the reference signal power is greater than the threshold. According to the present invention, the coefficient updating quantity monotonously increases if the reference signal power is smaller than a certain threshold, and monotonously decreases if the reference signal power is greater than the threshold.

(3) Comparison as to Operation and Advantages:

The learning identification method, the learning stop method, and the present invention were compared with respect to their performance according to a computer simulation using reference input signals and echoes that were recorded in an automobile. The LMS algorithm was excluded from the computer simulation because it is necessary in the LMS algorithm to establish parameters depending on the reference signal power and the LMS algorithm is not suitable for handling non-stationary signals such as speech. Woman's speech was used as the reference signal. Echoes and noise were recorded while the automobile with a diesel engine mounted was idling.

FIG. 3 shows the average power of combined signals of echoes and noise in echo canceller output signals. The average power of noise is about $10^9$ and maintained at a substantially constant level. In the learning identification method shown in FIG. 3(b), the echo power increased from the echo power before it was processed. In the adaptation stop method and the proposed method of the invention shown in FIGS. 3(c) and 3(d), the echo power was suppressed. The remaining echo power in the proposed process is less than ½ of that in the adaptation stop process. The amount of calculations required by the present invention is about the same as that in the conventional processes.

5. Reduction to Practice:

(3) Experienced:

The operation of the present invention was confirmed according to a computer simulation and a hardware arrangement using a floating-decimal-point DSP. The results of the computer simulation are given in "4. Relationship to the prior art" above. Hardware-based evaluation indicates that the present invention can sufficiently remove echoes in an environment in which noise is mixed, which the learning identification process would fail to remove at all.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 2 shows the relationship between the coefficient updating quantity and the reference signal power of each of the methods.

FIG. 4 is a block diagram of an echo canceller as a system identification apparatus according to a first embodiment of the present invention;

DETAILED DESCRIPTION OF THE PREFERRED EMBODIMENTS

Figure 1:
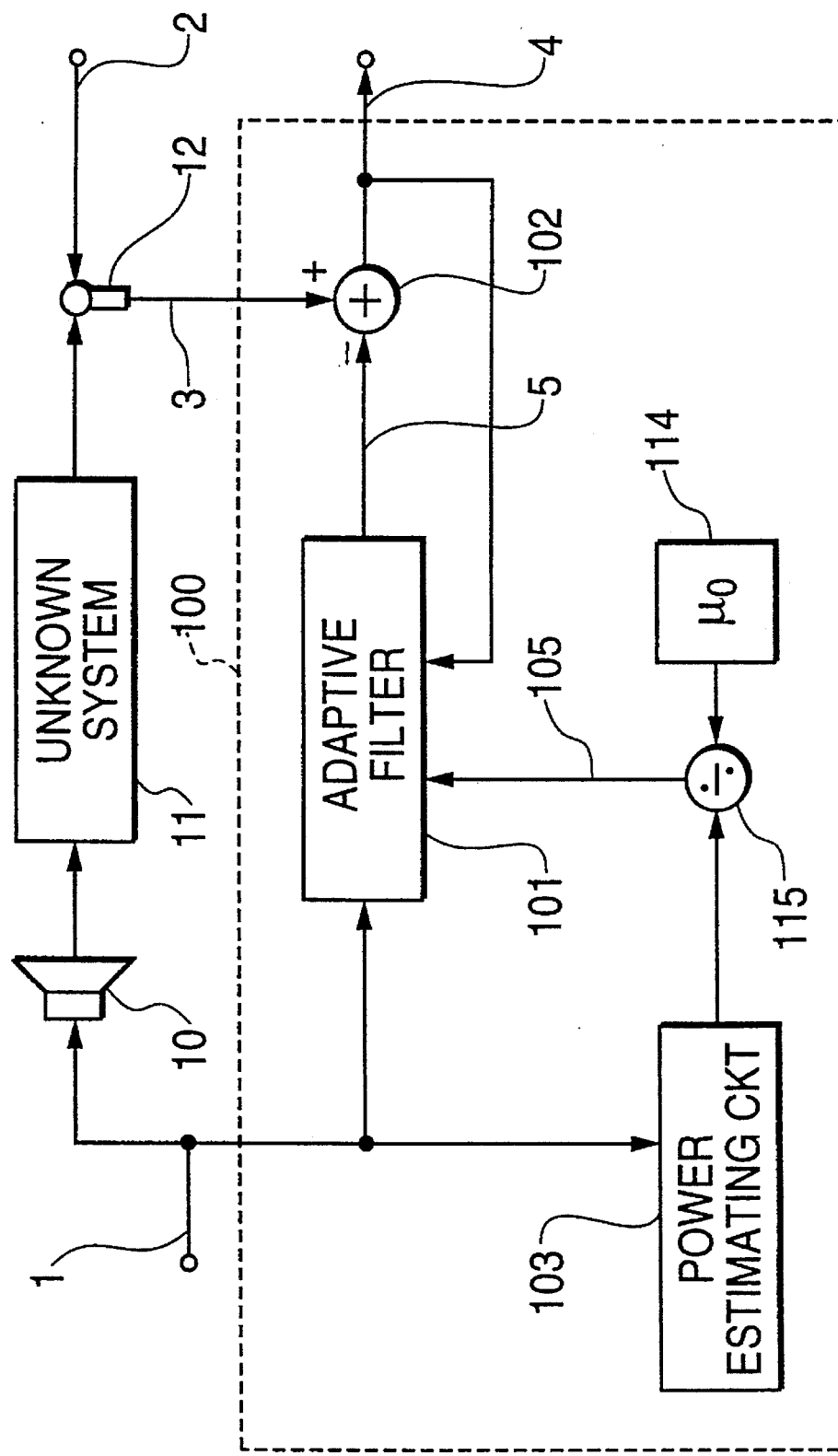
FIG. 1 is a block diagram of an echo canceller as a system identification apparatus based on the learning identification method.
Figure 3A:
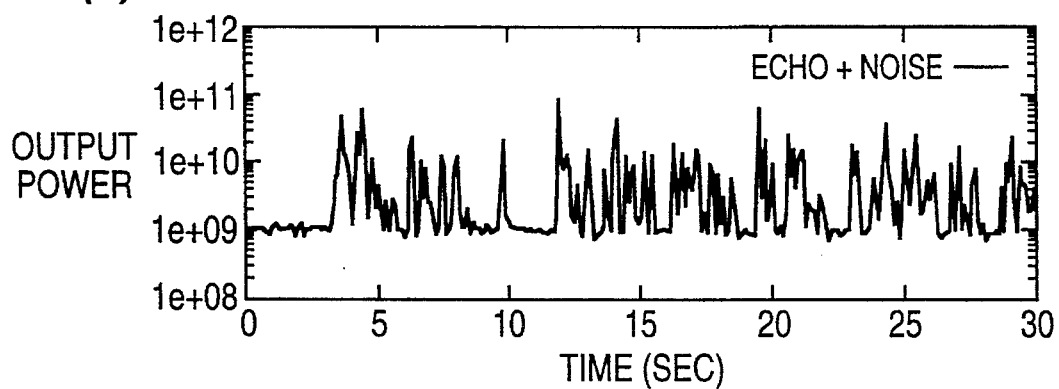
FIGS. 3(a)–3(d) show the average power of combined signals of echoes and noise in echo canceller output signals.
Figure 3B:
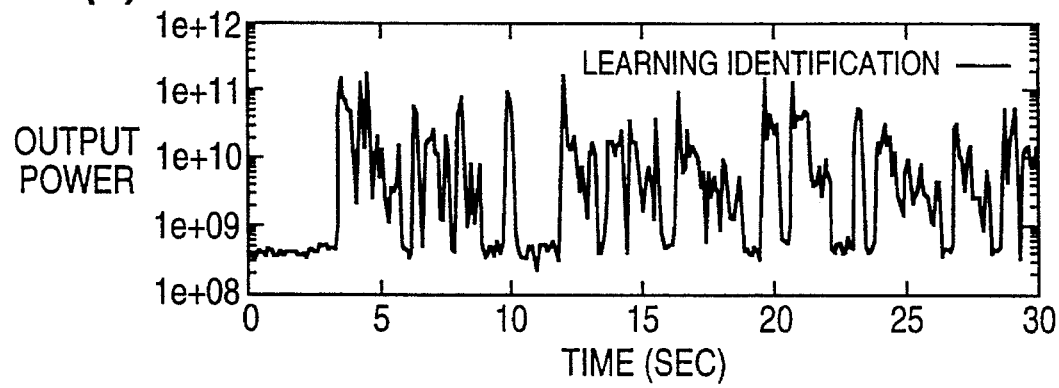
Figure 3C:
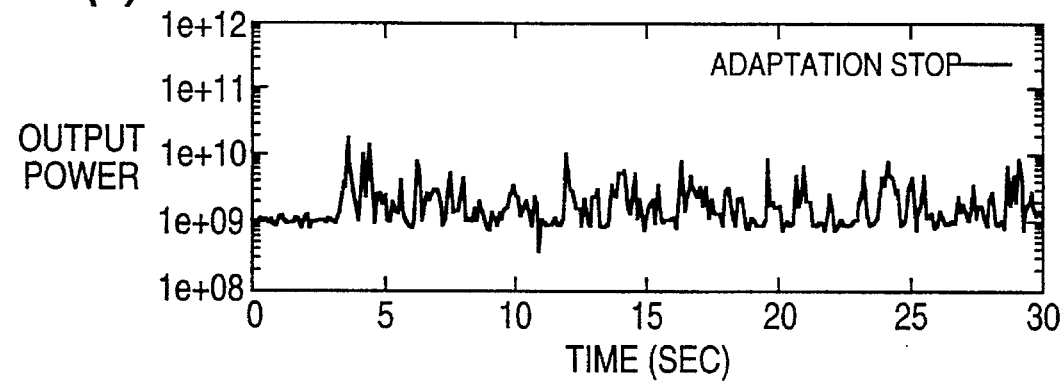
Figure 3D:
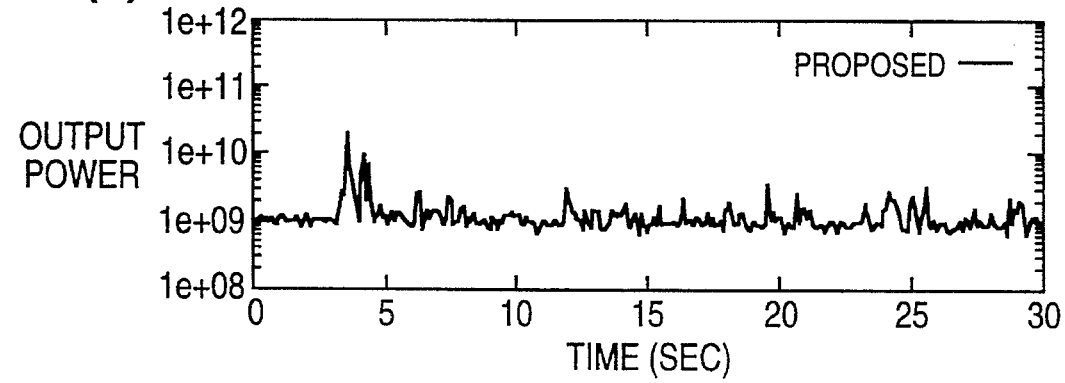

Echo cancellers for removing an acoustic echo which is produced when a received signal is propagated from a loudspeaker through a spatial acoustic path and received by a microphone, according to preferred embodiments of the present invention will be described in detail below with reference to FIGS. 4 through 22. In each of the preferred embodiments, a system identification apparatus is used as the echo canceller.

FIG. 4 shows in block form an echo canceller 100 according to a first embodiment of the present invention. A reference input signal 1 is converted by a loudspeaker 10 into an acoustic signal which is propagated through an acoustic path 11 as an unknown system and reaches, as an acoustic echo, a microphone 12. The microphone 12 converts the acoustic echo, with noise 2 added thereto, into an electric signal as an observed signal 3. An adaptive filter 101 effects a convolutional calculation on the reference input signal 1 and filter coefficients, and supplies the result as an output signal 5 to a subtractor 102. The subtractor 102 subtracts the output signal 5 from the observed signal 3, and produces a resultant error signal 4 as an output signal from the echo canceller 100, which is supplied to the adaptive filter 101. A power estimating circuit 103 estimates the power of the reference input signal 1, and supplies the estimated power to a step size determining circuit 104. The step size determining circuit 104 determines a step size 105 based on the power of the reference input signal 1, and supplies the determined step size 105 to the adaptive filter 101. The adaptive filter 101 corrects the filter coefficients in order to minimize the error signal 4, using the reference input signal 1, the error signal 4, and the step size 105.

The step size determining circuit 104 generates a step size $\mu(t)$ according to a function of the power $P_x(t)$ of the reference input signal 1 which increases monotonously if the power $P_x(t)$ of the reference input signal 1 is smaller than a first threshold $P_{th}$ and decreases monotonously if the power $P_x(t)$ of the reference input signal 1 is greater than the first threshold $P_{th}$. The step size $\mu(t)$ may be given by:

$$\mu(t) = \frac{\mu_0 P_x(t)}{P_{th}^2 + P_x^2(t)} \quad (8)$$

Alternatively, the step size $\mu(t)$ may be expressed according to a higher-order function:

$$\mu(t) = \frac{\sum_{i=0}^{K} a_i P_x^i(t)}{\sum_{j=0}^{L} b_j P_x^j(t)} \quad (9)$$

Further alternatively, the step size $\mu(t)$ may be expressed, using a monotonously increasing function $F_1(P_x(t))$ and a monotonously decreasing function $F_2(P_x(t))$, as follows:

$$\mu(t) = \begin{cases} F_1(P_x(t)) & (P_x(t) < P_{th}) \\ F_2(P_x(t)) & (P_{th}(t) \leq P_x(t)) \end{cases} \quad (10)$$

Examples of the functions $F_1(P_x(t))$, $F_2(P_x(t))$ are:

$$F_1(P_x(t)) = \frac{\mu_0 P_x(t)}{P_{th}^2} \quad (11)$$

$$F_2(P_x(t)) = \frac{\mu_0}{P_x(t)} \quad (12)$$

The functions $F_1(P_x(t))$, $F_2(P_x(t))$ may alternatively be higher-order functions. A special function such as an exponential function may also be used other than a power function of $P_x(t)$.

Figure 5:
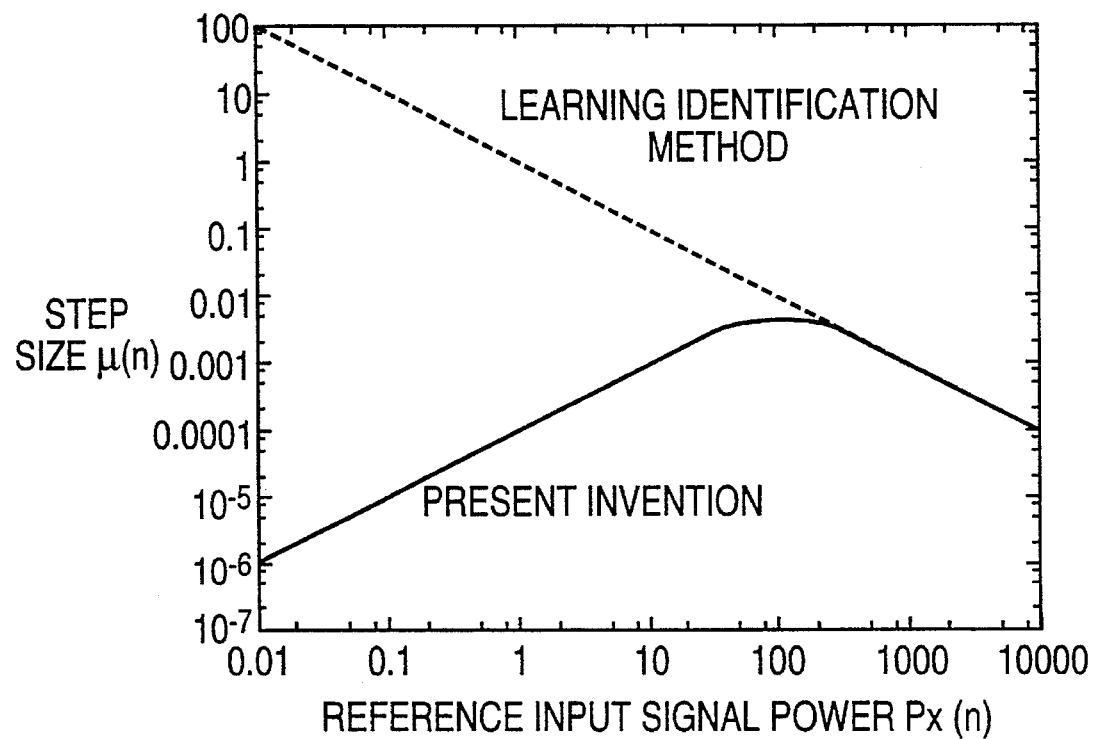
FIG. 5 is a graph showing a step size used in the system identification apparatus according to the first embodiment.

FIG. 5 shows step sizes of the conventional learning identification method and the system identification apparatus according to the present invention. Since the step size of the learning identification process is inversely proportional to the reference input signal power $P_x(t)$, the step size has a large value when the reference input signal power $P_x(t)$ is small. The step size according to the present invention has a small value when the reference input signal power $P_x(t)$ is small. Therefore, it can be seen that the step size according to the present invention behaves in a largely different manner when the reference input signal power $P_x(t)$ is small.

A transversal adaptive filter as the adaptive filter 101 will be described below. An output signal y(t) from the adaptive filter is given by the equation (2), and the filter coefficient $w_i(t)$ is updated according to the equation (4). The above process can be achieved by connecting in cascade calculating circuits each for carrying out a one-tap calculation. A j-th calculating circuit (j=1, ..., N) is supplied with a delay element input signal $x_{j-1}(t)$, an adder input signal $y_{j-1}(t)$, and a filter coefficient updating quantity W(t), effects a delaying process according to the equation:

$$x_j(t) = x_{j-1}(t-1) \quad (13)$$

effects a convolutional calculation according to the equation:

$$y_j(t) = y_{j-1}(t) + w_{j-1}(t) x_{j-1}(t) \quad (14)$$

updates the filter coefficient according to the equation:

$$w_{j-1}(t+1) = w_{j-1}(t) + W(t) x_{j-1}(t) \quad (15)$$

and outputs a delay element output signal $x_j(t)$ and an adder output signal $y_j(t)$, where $x_0(t)$ and $y_0(t)$ are given by:

$$x_0(t) = x(t) \quad (16)$$

$$y_0(t) = 0 \quad (17)$$

and the filter coefficient updating quantity W(t) is defined by:

$$W(t) = \mu(t) e(t) \quad (18)$$

Figure 6:
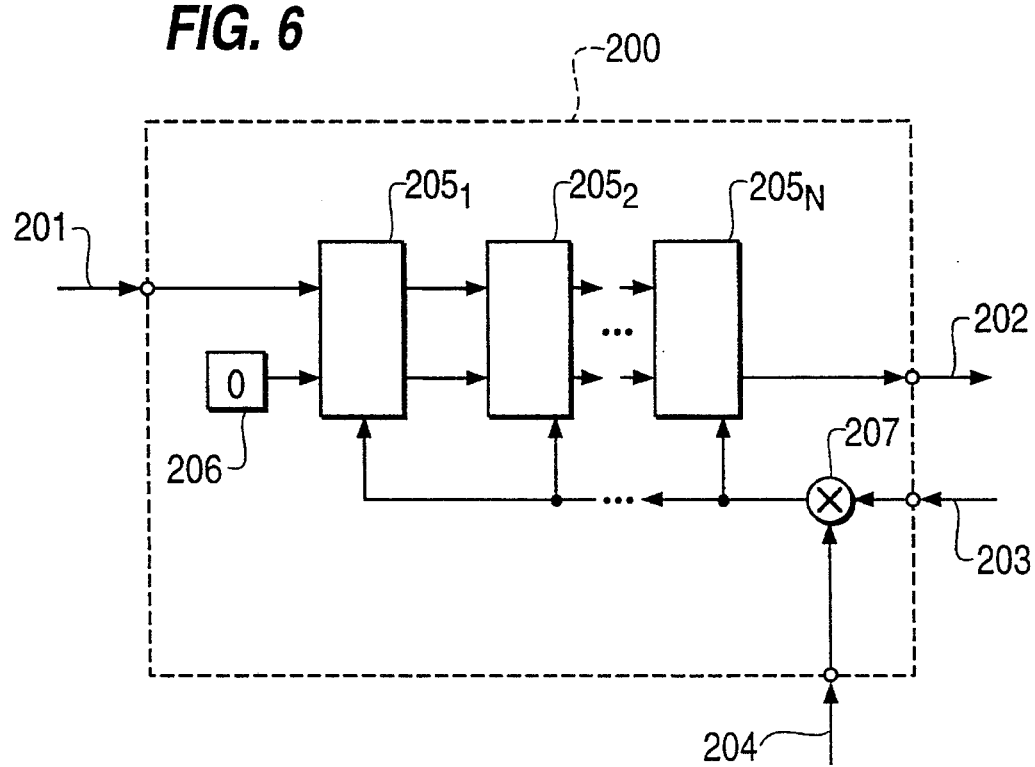
FIG. 6 is a block diagram of an adaptive filter shown in FIG. 4.

FIG. 6 shows the adaptive filter 101 in detail. The adaptive filter, indicated by 200 in FIG. 6, is supplied with a reference input signal 201, and calculates an output signal 202 and updates the filter coefficients in order to reduce an error signal 203. The reference input signal 201 is supplied as a delay element input signal to a first calculating circuit 205₁. Using the reference input signal 201 as a delay unit input signal and a constant 0 stored in a first constant register 206 as an adder input signal, the first calculating circuit 205₁ effects a delaying process and convolutional calculation, and updates the filter coefficient. The first calculating circuit 205₁ supplies a delay element output signal as a delay element input signal to a second calculating circuit 205₂, and an adder output signal as an adder input signal to the second calculating circuit 205₂. Using the delay element output signal from the first calculating circuit 205₁ as a delay element input signal and the adder output signal from the first calculating circuit 205₁ as an adder input signal, the second calculating circuit 205₂ effects a delaying process and convolutional calculation, and updates the filter coefficient. The second calculating circuit 205₂ supplies a delay element output signal as a delay element input signal to a third calculating circuit 205₃, and an adder output signal as an adder input signal to the third calculating circuit 205₃. As with the second calculating circuit 205₂, a j-th calculating circuit 205ⱼ (j=3, ..., N-1) uses a delay element output signal from a (j-1)-th calculating circuit 205ⱼ₋₁ as a delay element input signal and an adder output signal from the (j-1)-th calculating circuit 205ⱼ₋₁ as an adder input signal, and effects a delaying process and convolutional calculation, and updates the filter coefficient. The j-th calculating circuit 205ⱼ supplies a delay element output signal as a delay element input signal to a (j+1)-th calculating circuit 205ⱼ₊₁ and an adder output signal as an adder input signal to the (j+1)-th calculating circuit 205ⱼ₊₁. Similarly, an N-th calculating circuit 205ₙ uses a delay element output signal from a (N-1)-th calculating circuit 205ₙ₋₁ as a delay element input signal and an adder output signal from the (N-1)-th calculating circuit 205ₙ₋₁ as an adder input signal, and effects a delaying process and convolutional calculation, and updates the filter coefficient. The N-th calculating circuit 205ₙ produces an adder output signal as the output signal 202 of the adaptive filter 200. A delay element output signal from the Nth calculating circuit 205ₙ is not used. A multiplier 207 multiplies the error signal 203 by a step size 204, and supplies a resultant product to the N calculating circuits 205₁, ..., 205ₙ.

Figure 7:
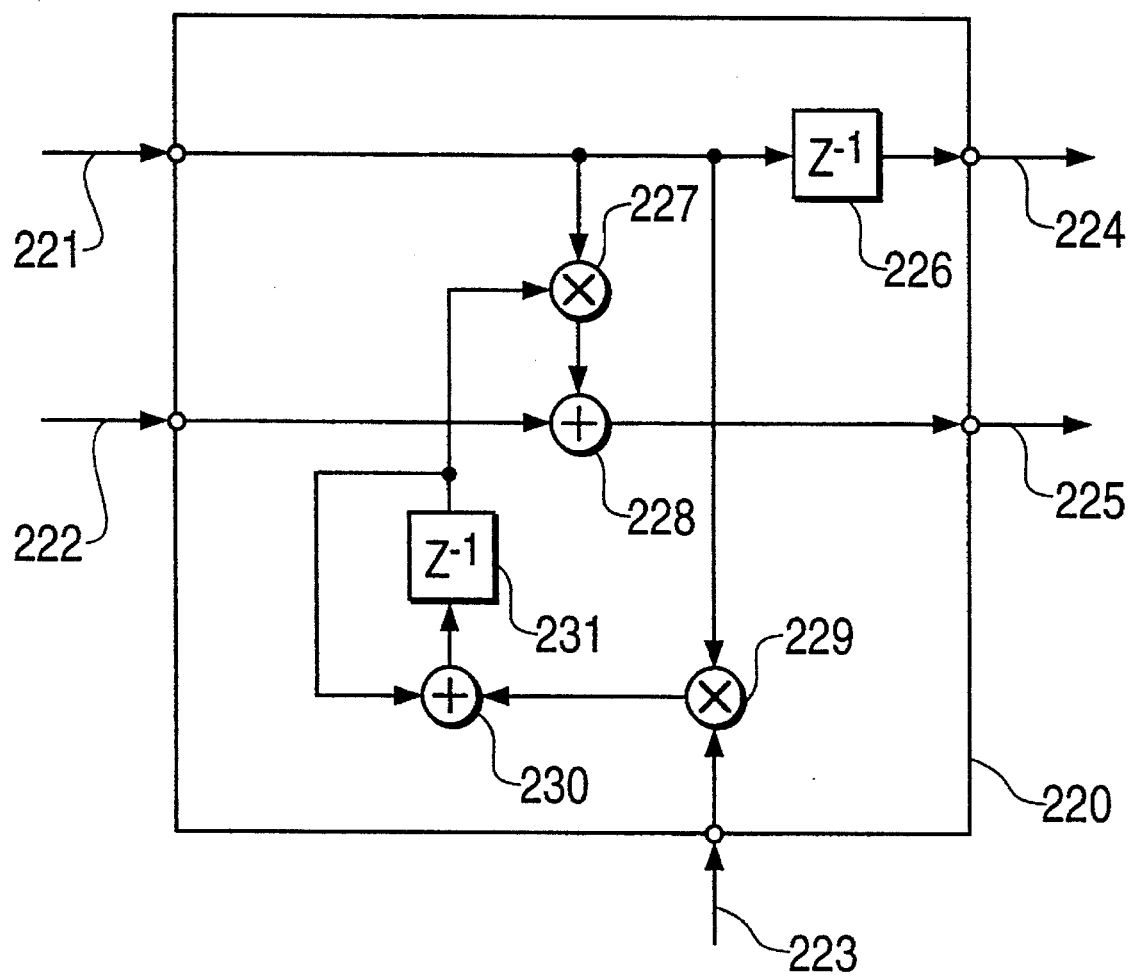
FIG. 7 is a block diagram of a calculating circuit shown in FIG. 6.

FIG. 7 shows details of each of the calculating circuits 205₁, ..., 205ₙ. The calculating circuit, indicated by 220 in FIG. 7, uses a delay element input signal 221, an adder input signal 222, and a filter coefficient updating quantity 223, effects a delaying process and convolutional calculation, and updates the filter coefficient, and produces a delay element output signal 224 and an adder output signal 225.

The delay element input signal 221 is supplied to a delay element 226 and a first multiplier 227. The delay element 226 delays the delay unit input signal 221 by one sample, and outputs the delayed signal as the delay element output signal 224. The first multiplier 227 multiplies the delay unit input signal 221 by the content of a coefficient register 231, and supplies a resultant product to a first adder 228. The first adder 228 adds the product from the first multiplier 227 and the adder input signal 222, and outputs a resultant sum as the adder output signal 225.

A second multiplier 229 multiplies the delay element input signal 221 by the filter coefficient updating quantity 223, and supplies a resultant product to a second adder 230. The second adder 230 adds the product from the second multiplier 229 and the content of the coefficient register 231, and stores a resultant sum in the coefficient register 231.

While the transversal adaptive filter has been described above with reference to FIGS. 4–7, the principles of the present invention are also applicable to any adaptive filter which can update the filter coefficient using a step size, e.g., a recursive adaptive filter or a nonlinear adaptive filter.

Figure 8:
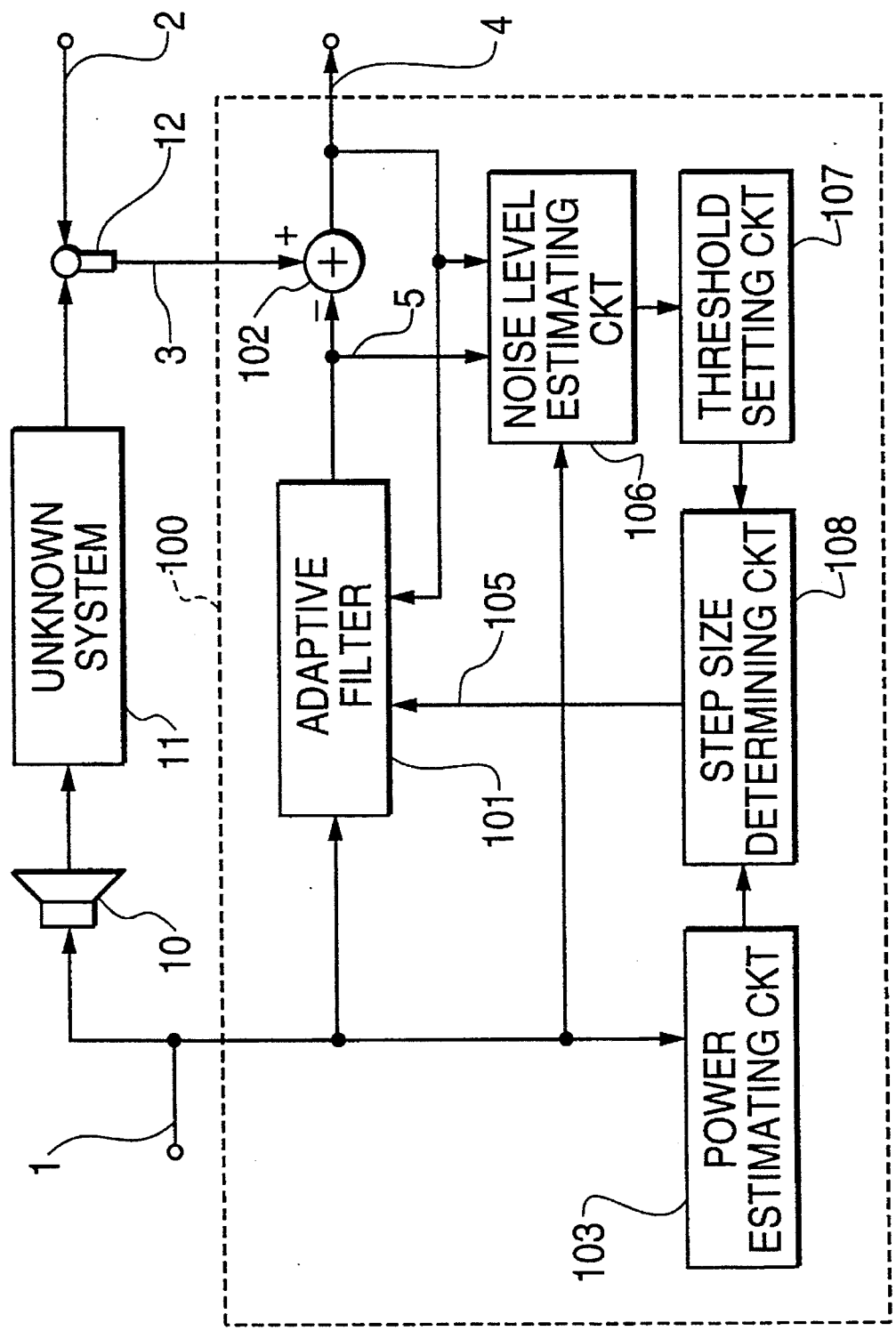
FIG. 8 is a block diagram of an echo canceller as a system identification apparatus according to a second embodiment of the present invention.

FIG. 8 shows in block form an echo canceller 100 according to a second embodiment of the present invention. A reference input signal 1 is converted by a loudspeaker 10 into an acoustic signal which is propagated through an acoustic path 11 as an unknown system and reaches, as an acoustic echo, a microphone 12. The microphone 12 converts the acoustic echo, with noise 2 added thereto, into an electric signal as an observed signal 3. An adaptive filter 101 effects a convolutional calculation on the reference input signal 1 and filter coefficients, and supplies the result as an output signal 5 to a subtractor 102. The subtractor 102 subtracts the output signal 5 from the observed signal 3, and produces a resultant error signal 4 as an output signal from the echo canceller 100, which is supplied to the adaptive filter 101. A power estimating circuit 103 estimates the power $P_x(t)$ of the reference input signal 1, and supplies the estimated power to a step size determining circuit 108. A noise level estimating circuit 106 estimates the level of the noise 2 mixed in the observed signal 3 based on the reference input signal 1, the error signal 4, and the output signal 5 from the adaptive filter 101, and supplies the estimated level to a threshold setting circuit 107. The threshold setting circuit 107 establishes a first threshold $P_{th}$ based on the noise level, and supplies the first threshold $P_{th}$ to the step size determining circuit 108. The step size determining circuit 108 determines a step size 105 based on the power of the reference input signal 1 and the first threshold $P_{th}$, and supplies the determined step size 105 to the adaptive filter 101. The adaptive filter 101 corrects the filter coefficients in order to minimize the error signal 4, using the reference input signal 1, the error signal 4, and the step size 105.

The first threshold $P_{th}$ may be represented by any function of the noise level $P_n(t)$, which should preferably monotonously increase when the noise level $P_n(t)$ increases. As an example, it is simplest to use a function proportional to the noise level $P_n(t)$ as follows:

$$P_{th} = \alpha P_n(t) \quad (19)$$

where $\alpha$ is a positive constant. The first threshold $P_{th}$ may alternatively be of a higher-order function.

Figure 9:
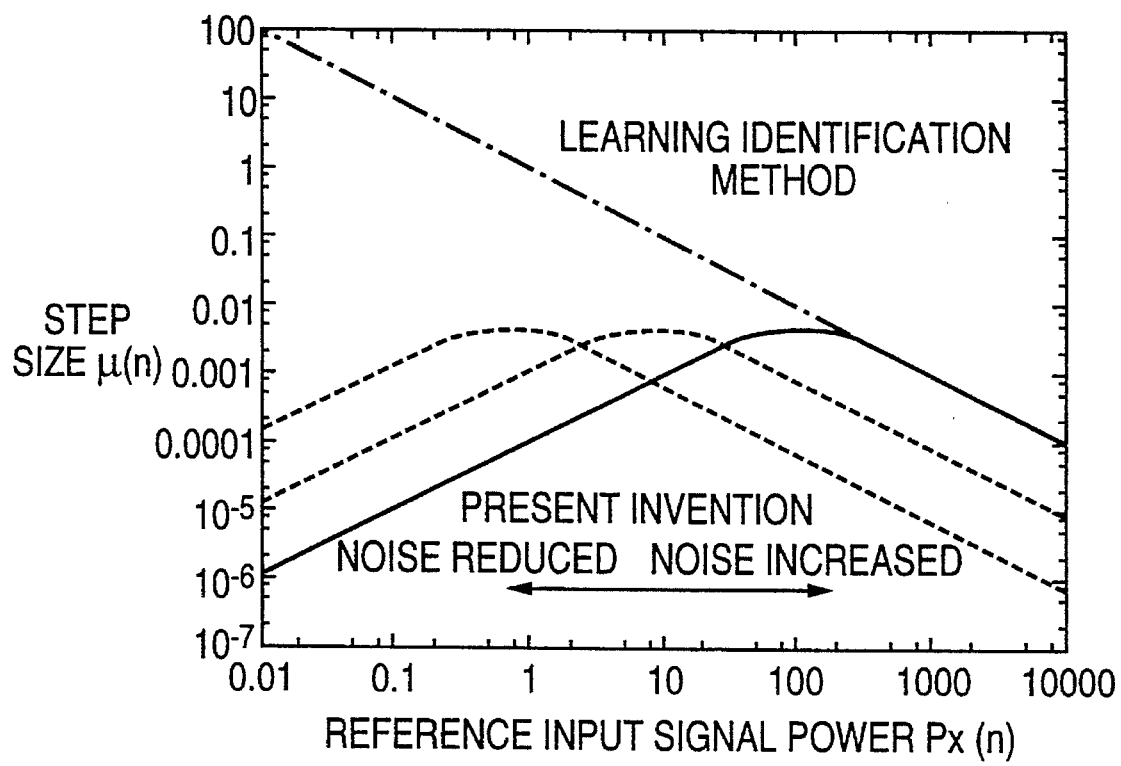
FIG. 9 is a graph showing a step size used in the system identification apparatus according to the second embodiment.

FIG. 9 shows step sizes of the second embodiment of the present invention and the conventional learning identification process. The reference input signal power $P_x(t)$ at which the step size $\mu(t)$ is maximum varies depending on the noise level. An example of such step size $\mu(t)$ may be indicated by:

$$\mu(t) = \frac{\mu_0 P_x(t)}{P_{th}(C + (P_x(t) - P_{th})^2)} \quad (20)$$

In this example, the numerator of $\mu(t)$ is a linear function of $P_x(t)$ and the denominator thereof is a quadratic function of $P_x(t)$. However, they may be of functions of any order.

Figure 10:
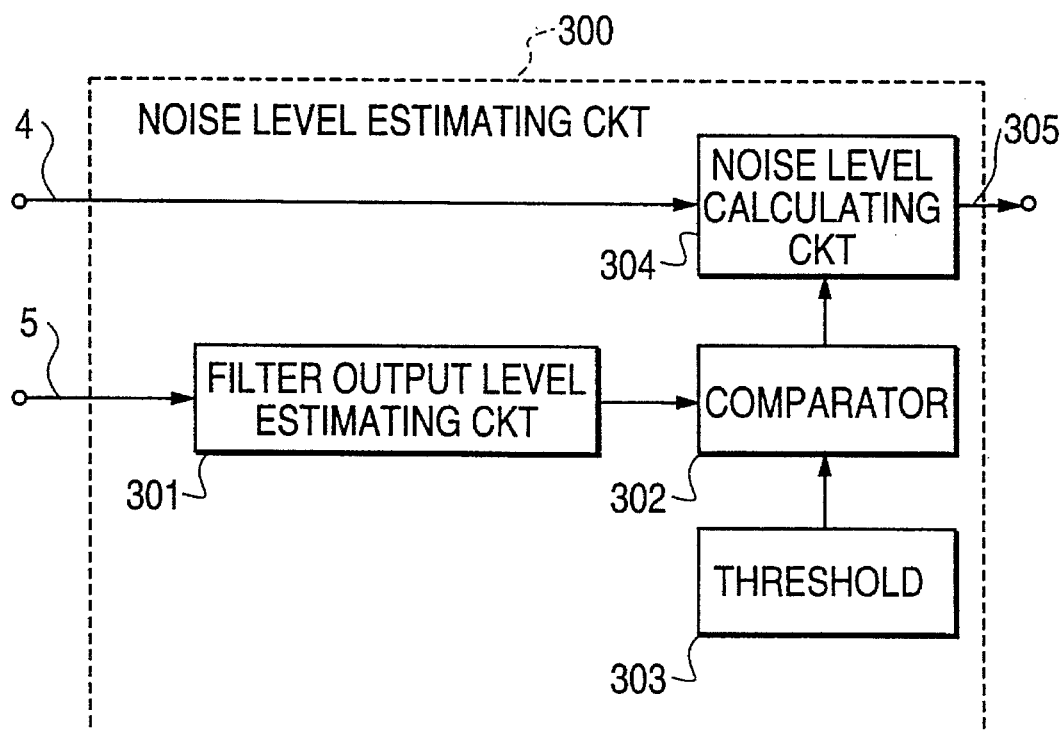
FIG. 10 is a block diagram of a first embodiment of a noise level estimating circuit shown in FIG. 8.

FIG. 10 shows a first embodiment of the noise level estimating circuit 106 in the system identification apparatus shown in FIG. 8. The noise level estimating circuit, indicated by 300 in FIG. 10, is supplied with the error signal 4 and the output signal 5 from the adaptive filter as input signals, estimates the level of the noise 2 mixed in the error signal 4, and outputs an estimated noise level 305. A filter output level estimating circuit 301 estimates the level of the output signal 5 from the adaptive filter, and supplies an estimated level of the output signal 5 to a comparator 302. The comparator 302 compares the estimated level of the output signal 5 with a second threshold stored in a register 303, and supplies a compared result to a noise level calculating circuit 304.

If the comparator 302 determines that the level of the output signal 5 is smaller than the second threshold, then the noise level calculating circuit 304 updates an estimated noise level using the error signal 4. If the comparator 302 determines that the level of the output signal 5 is not smaller than the second threshold, then the noise level calculating circuit 304 holds a preceding estimated noise level. The calculated result from the noise level calculating circuit 304 is produced as the output signal 305 of the noise level estimating circuit 300.

Figure 11:
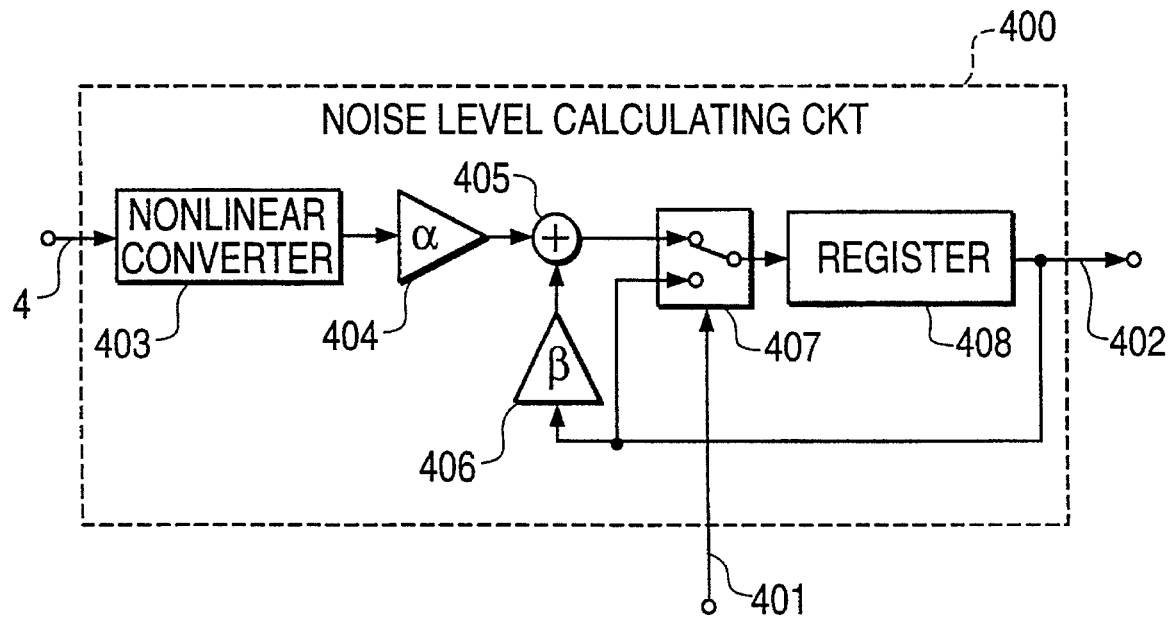
FIG. 11 is a block diagram of the noise level estimating circuit shown in FIG. 10.

FIG. 11 shows the noise level calculating circuit 304 in detail. The noise level calculating circuit, indicated by 400 in FIG. 11, calculates the level of the noise mixed in the error signal 4 based on the error signal 4 and a control signal 401 supplied from the comparator 302, and outputs the calculated level as a noise level 402. A nonlinear converter 403 nonlinearly converts the error signal 4 in a predetermined manner, and supplies the converted signal to a first coefficient multiplier 404. The first coefficient multiplier 404 multiplies the converted signal from the nonlinear converter 403 by a predetermined constant $\alpha$, and supplies a resultant product to an adder 405. The adder 405 adds products from the first coefficient multiplier 404 and a second coefficient multiplier 406, and supplies a resultant sum to a selector 407. The selector 407 is supplied with the control signal 401, the sum signal from the adder 405, and a signal from a register 408. If the control signal 401 indicates that the estimated noise level be updated, the selector 407 supplies the sum signal from the adder 405 to the register 408. If not, then the selector 407 returns the signal from the register 408 to the register 408. The register 408 stores the calculated noise level 402, outputs the noise level 402 as the calculated result from the noise level calculating circuit, and supplies the noise level 402 to the second coefficient multiplier 406 and the selector 407.

The second coefficient multiplier 406 multiplies the noise level 402 by a predetermined constant $\beta$, and supplies a resultant product to the adder 405.

The nonlinear converter 403 may comprise any nonlinear converter which converts the error signal 4 into a value which is not negative. For example, the nonlinear converter 403 may be a squaring circuit or an absolute value calculating circuit. The constant $\alpha$ may be any positive constant, and the constant $\beta$ may be any positive number equal to or smaller than 1. If the constant $\alpha$ is $1-\beta$, then the noise level 402 is represented by a weighted moving average of the nonlinearly converted signal.

Figure 12:
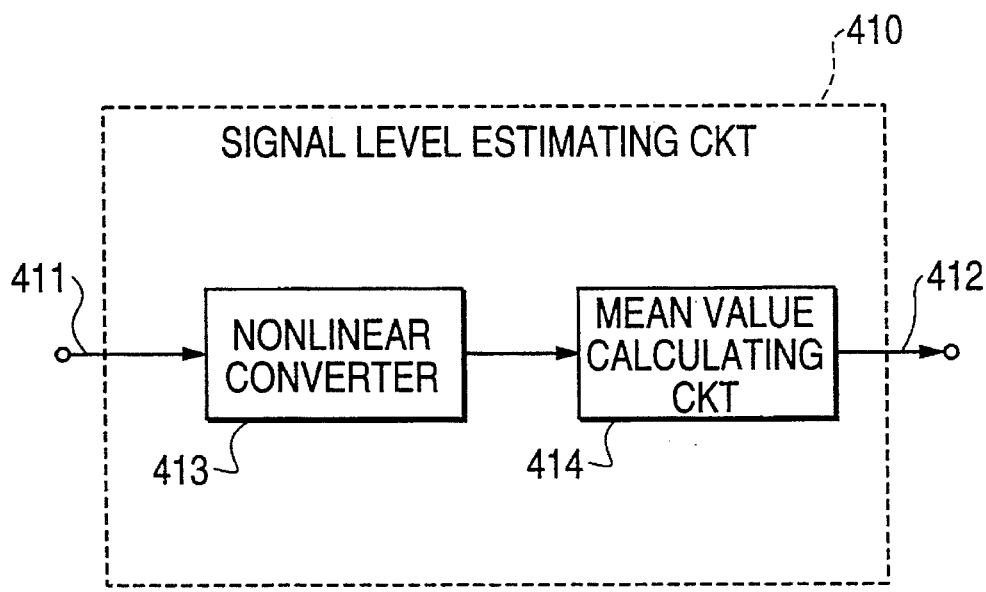
FIG. 12 is a block diagram of a signal level estimating circuit shown in FIG. 10.

FIG. 12 shows a signal level estimating circuit 410 as the filter output level estimating circuit 301. The signal level estimating circuit 410 estimates the level of an input signal 411, and outputs an estimated signal level 412. A nonlinear converter 413 nonlinearly converts the input signal 411 in a predetermined manner, and supplies the converted signal to a mean value calculating circuit 414. The mean value calculating circuit 414 calculates a mean value of converted signals from the nonlinear converter 413, and outputs a calculated mean value as the signal level 412.

As with the nonlinear converter 403 in the noise level calculating circuit 400, the nonlinear converter 413 may comprise any nonlinear converter which converts the input signal 411 into a non-negative value. The mean value calculating circuit 414 may comprise any mean value calculating circuit such as a simple mean value calculating circuit or a weighted moving average calculating circuit. Alternatively, the mean value calculating circuit may be dispensed with, and an instantaneous value of the nonlinearly converted signal may be employed.

Figure 13:
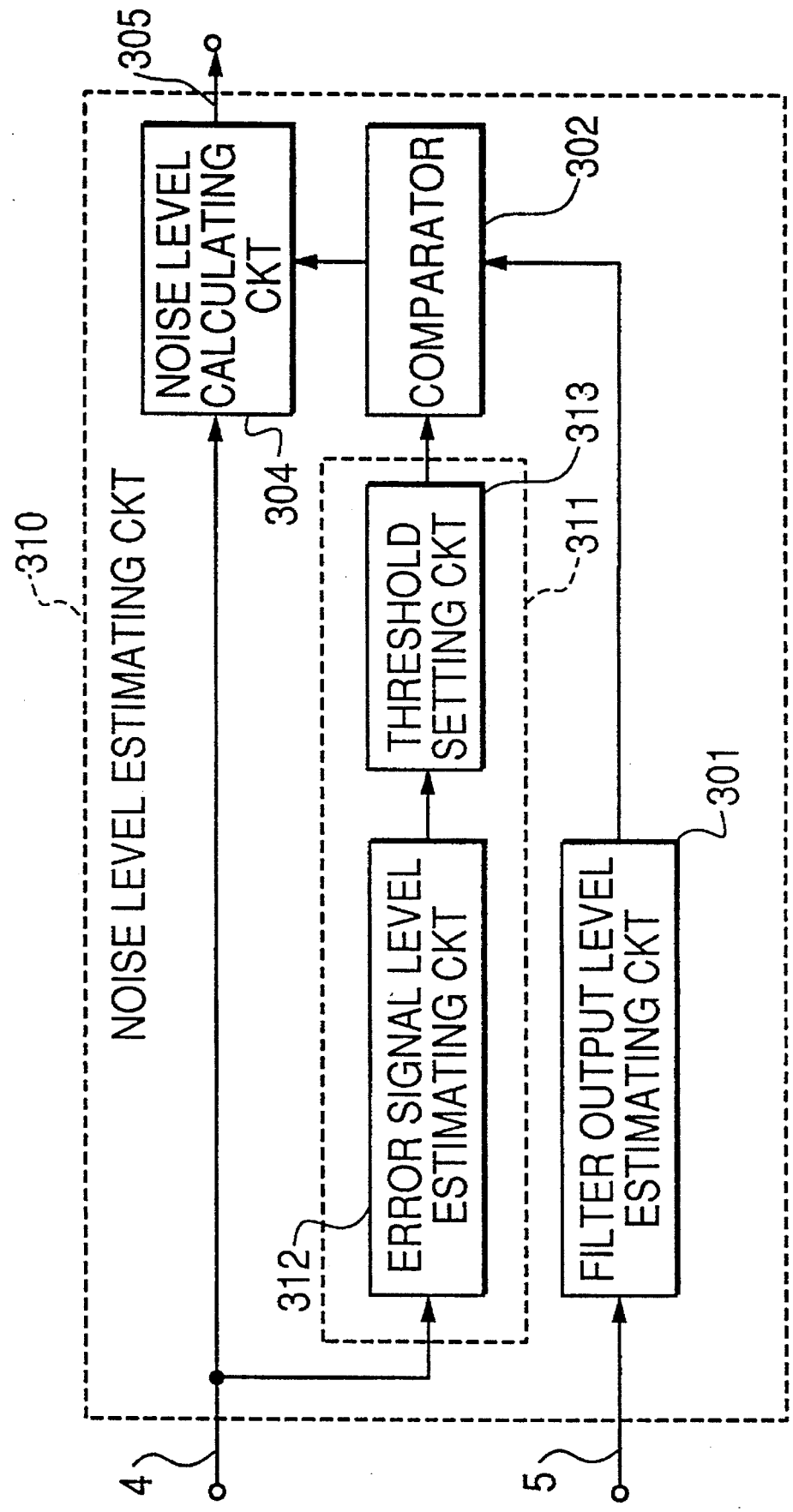
FIG. 13 is a block diagram of a second embodiment of the noise level estimating circuit shown in FIG. 8.

FIG. 13 shows a second embodiment of the noise level estimating circuit 106 in the system identification apparatus shown in FIG. 8. The noise level estimating circuit, indicated by 310 in FIG. 13, varies the second threshold in the noise level estimating circuit 300 shown in FIG. 10 depending on the error signal. The noise level estimating circuit 310 is supplied with the error signal 4 and the output signal 5 from the adaptive filter as input signals, estimates the level of the noise 2 mixed in the error signal 4, and outputs an estimated noise level 305. A filter output level estimating circuit 301 estimates the level of the output signal 5 from the adaptive filter, and supplies an estimated level of the output signal 5 to a comparator 302. A threshold generator 311 comprises an error signal level estimating circuit 312 and a threshold setting circuit 313. The error signal level estimating circuit 312 estimates the level of the error signal 4, and supplies the estimated level to the threshold setting circuit 313. The threshold setting circuit 313 generates a threshold depending on the estimated level of the error signal 4, and supplies the generated threshold as a second threshold to the comparator 302. The comparator 302 compares the estimated level of the output signal 5 from the adaptive filter with the second threshold from the threshold generator 311, and supplies a compared result to a noise level calculating circuit 304.

If the comparator 302 determines that the level of the output signal 5 is smaller than the second threshold, then the noise level calculating circuit 304 updates an estimated noise level using the error signal 4. If the comparator 302 determines that the level of the output signal 5 is not smaller than the second threshold, then the noise level calculating circuit 304 holds a preceding estimated noise level. The calculated result from the noise level calculating circuit 304 is produced as the output signal 305 of the noise level estimating circuit 310.

The error signal level estimating circuit 312 may comprise the signal level estimating circuit 400 shown in FIG. 12. The second threshold may be any function of the noise signal level, e.g., the product of the noise signal level and a constant or the sum of the noise signal level and a constant.

Figure 14:
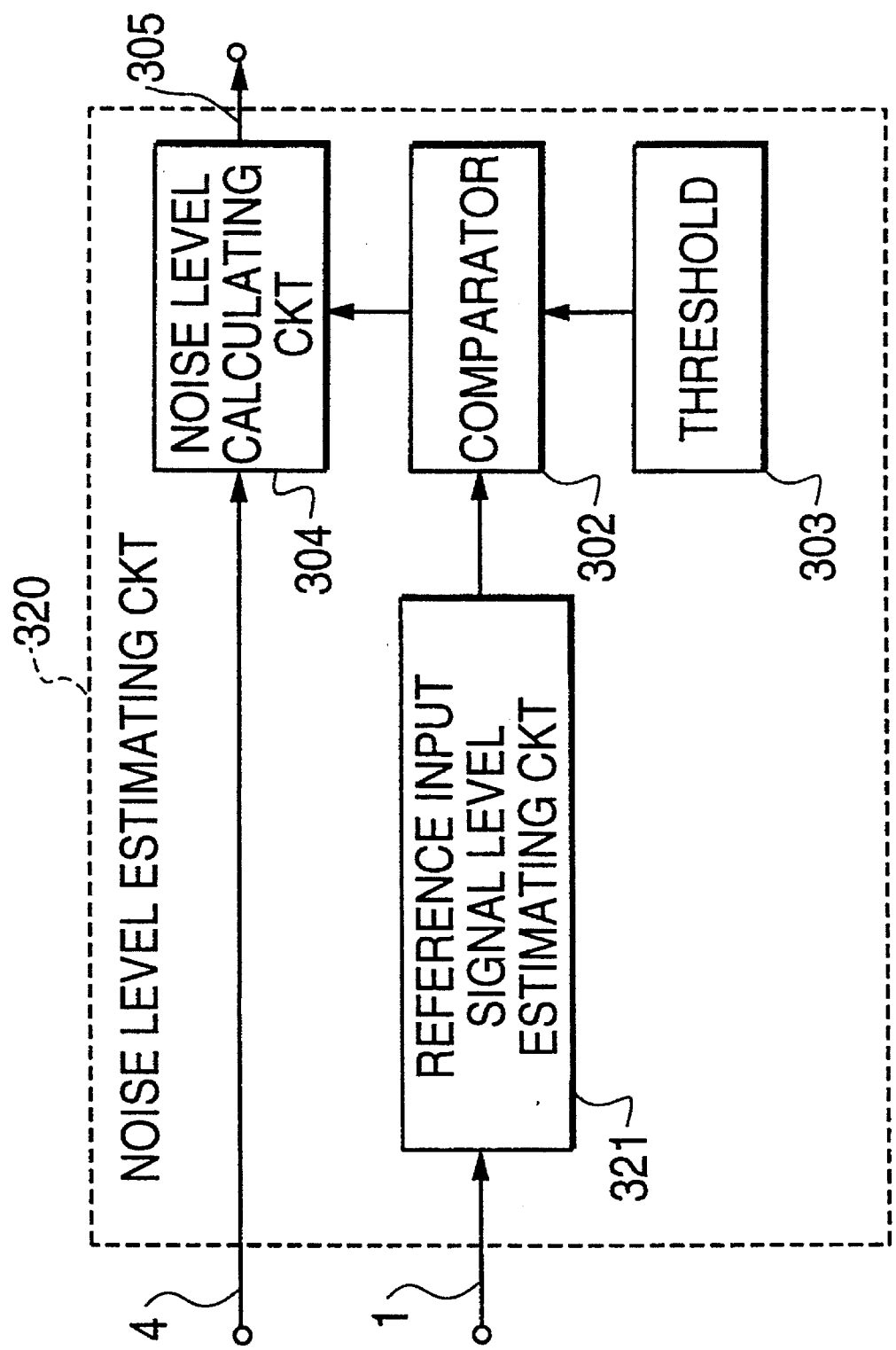
FIG. 14 is a block diagram of a third embodiment of the noise level estimating circuit shown in FIG. 8.

FIG. 14 shows a third embodiment of the noise level estimating circuit 106 in the system identification apparatus shown in FIG. 8. The noise level estimating circuit, indicated by 320 in FIG. 12, employs the reference input signal 1 in place of the filter output signal 5 in the noise level estimating circuit 300 shown in FIG. 10, and a third threshold in place of the second threshold in the noise level estimating circuit 300 shown in FIG. 10. The noise level estimating circuit 320 is supplied with the reference input signal 1 and the error signal 4 as input signals, estimates the level of the noise 2 mixed in the error signal 4, and outputs an estimated noise level 305. A reference input signal level estimating circuit 321 estimates the level of the reference input signal 1, and supplies an estimated level of the reference input signal 1 to a comparator 302. The cooperator 302 compares the estimated level of the reference input signal 1 with a third threshold stored in a register 303, and supplies a compared result to a noise level calculating circuit 304.

If the comparator 302 determines that the level of the reference input signal 1 is smaller than the third threshold, then the noise level calculating circuit 304 updates an estimated noise level using the error signal 4. If the comparator 302 determines that the level of the reference input signal 1 is not smaller than the third threshold, then the noise level calculating circuit 304 holds a preceding estimated noise level. The calculated result from the noise level calculating circuit 304 is produced as the output signal 305 of the noise level estimating circuit 320.

Figure 15:
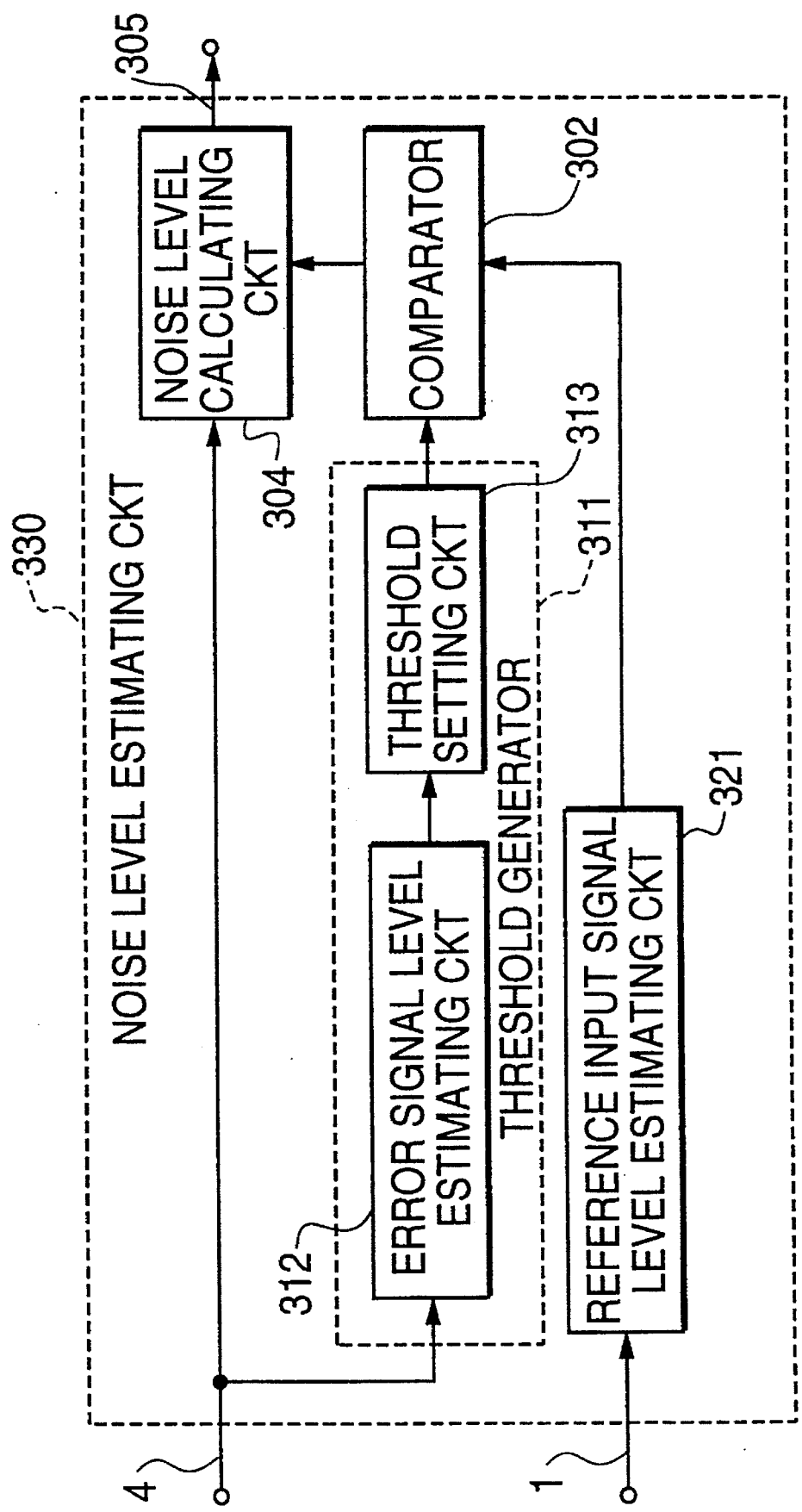
FIG. 15 is a block diagram of a fourth embodiment of the noise level estimating circuit shown in FIG. 8.

FIG. 15 shows a fourth embodiment of the noise level estimating circuit 106 in the system identification apparatus shown in FIG. 8. The noise level estimating circuit, indicated by 330 in FIG. 15, employs the reference input signal 1 in place of the filter output signal 5 in the noise level estimating circuit 310 shown in FIG. 13. The noise level estimating circuit 330 is supplied with the reference input signal 1 and the error signal 4 as input signals, estimates the level of the noise 2 mixed in the error signal 4, and outputs an estimated noise level 305. A reference input signal level estimating circuit 321 estimates the level of the reference input signal 1, and supplies an estimated level of the reference input signal 1 to a comparator 302. A threshold generator 311 comprises an error signal level estimating circuit 312 and a threshold setting circuit 313. The error signal level estimating circuit 312 estimates the level of the error signal 4, and supplies the estimated level to the threshold setting circuit 313. The threshold setting circuit 313 generates a threshold depending on the estimated level of the error signal 4, and supplies the generated threshold as a third threshold to the comparator 302. The comparator 302 compares the estimated level of the reference input signal 1 with the third threshold from the threshold generator 311, and supplies a compared result to a noise level calculating circuit 304.

If the comparator 302 determines that the level of the reference input signal 1 is smaller than the third threshold, then the noise level calculating circuit 304 updates an estimated noise level using the error signal 4. If the comparator 302 determines that the level of the reference input signal 1 is not smaller than the third threshold, then the noise level calculating circuit 304 holds a preceding estimated noise level. The calculated result from the noise level calculating circuit 304 is produced as the output signal 305 of the noise level estimating circuit 330.

Figure 16:
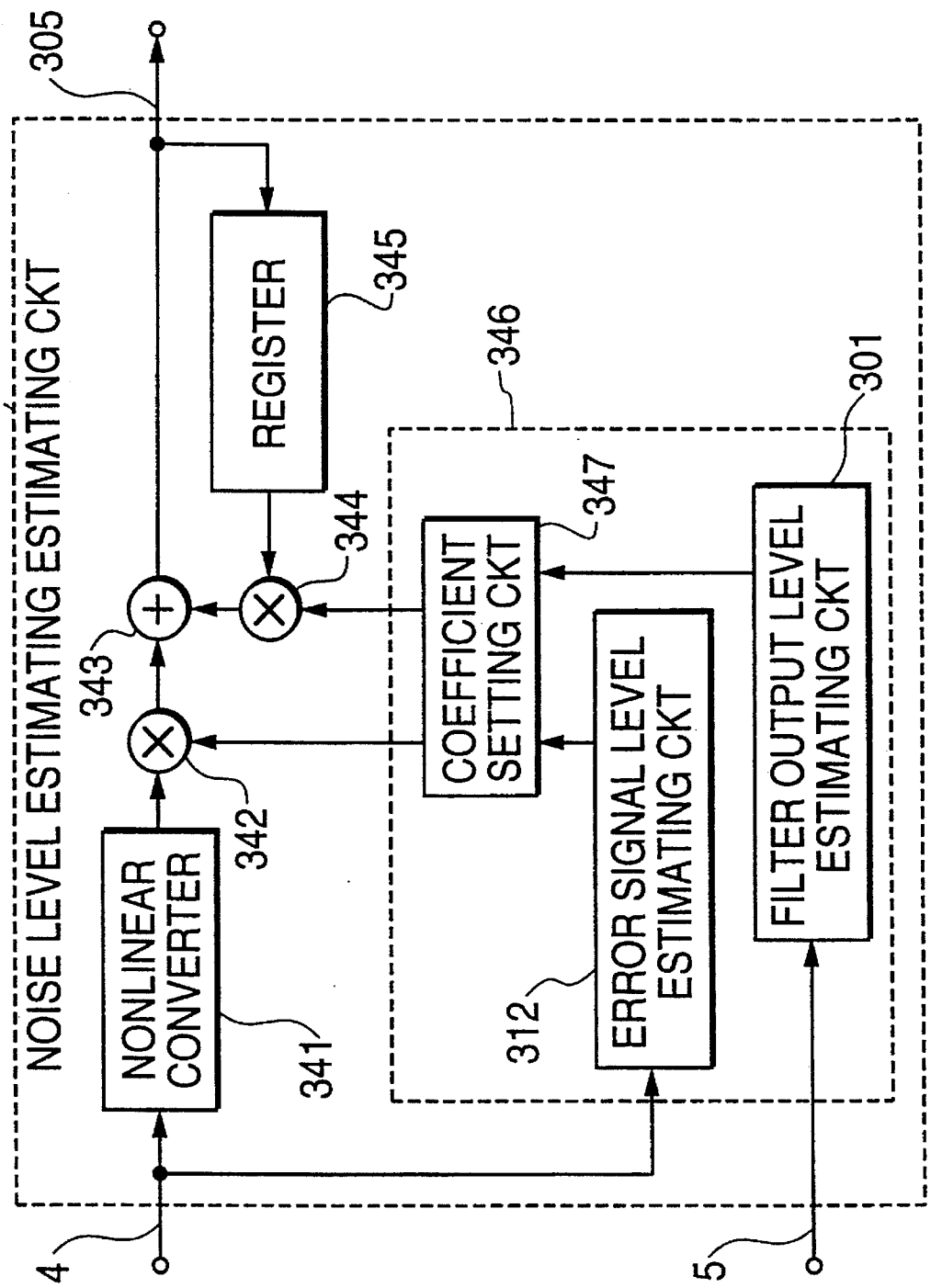
FIG. 16 is a block diagram of a fifth embodiment of the noise level estimating circuit shown in FIG. 8.

FIG. 16 shows a fifth embodiment of the noise level estimating circuit 106 in the system identification apparatus shown in FIG. 8. The noise level estimating circuit, indicated by 340 in FIG. 16, is supplied with the error signal 4 and the output signal 5 from the adaptive filter as input signals, estimates the level of the noise 2 mixed in the error signal 4, and outputs an estimated noise level 305. A nonlinear converter 341 nonlinearly converts the error signal 4 in a predetermined manner, and supplies the converted signal to a first multiplier 342. The first multiplier 342 multiplies the converted signal from the nonlinear converter 341 by a first coefficient generated by a coefficient generator 346, and supplies a resultant product to an adder 343. The adder 343 adds products from the first multiplier 342 and a second multiplier 344, and outputs a sum signal as a noise level 305, which is supplied to a register 345. The second multiplier 344 multiplies the content of the register 345 by a second coefficient generated by the coefficient generator 346, and supplies a resultant product to the adder 343. The coefficient generator 346 comprises a filter output level estimating circuit 301, an error signal level estimating circuit 312, and a coefficient setting circuit 347, and generates the first and second coefficients based on the error signal 4 and the output signal 5 from the adaptive filter. The filter output level estimating circuit 301 estimates the level of the output signal 5 from the adaptive filter, and supplies the estimated level to the coefficient setting circuit 347. The error signal level estimating circuit 312 estimates the level of the error signal 4, and supplies the estimated level to the coefficient setting circuit 347. The coefficient setting circuit 347 generates the first and second coefficients based on the filter output level and the error signal level, and supplies the generated first and second coefficients to the first and second multipliers 342, 344.

The first coefficient, indicated by $C_1$, is a real number which is not negative, and the second coefficient, indicated by $C_2$, is a real number which is equal to or smaller than 1 and not negative. The second coefficient $C_2$ is established such that it is small if the error signal level is greater than the filter output level, and large if the error signal level is smaller than the filter output level. An example of the second coefficient $C_2$ may be expressed by:

$$C_2 = P_0 + (1 - P_0)\left[\frac{P_y(t)}{P_e(t) + P_y(t)}\right]^K \quad (21)$$

where $P_e(t)$ is the error signal level, $P_y(t)$ is the filter output level, $P_0$ is a real number which is smaller than 1 and not negative, and K is any natural number. The first coefficient $C_1$ is established such that it is large if the error signal level is greater than the filter output level, and small if the error signal level is smaller than the filter output level. An example of the first coefficient $C_1$ may be expressed by:

$$C_1 = 1 - C_2 \quad (22)$$

The first coefficient $C_1$ may alternatively be a real-number constant which is not negative.

In the above embodiment, the level of the noise 2 mixed in the error signal 4 is estimated using the error signal 4 and the output signal 5 from the adaptive filter as input signals. However, the output signal 5 from the adaptive filter may be replaced with the reference input signal 1.

Figure 17:
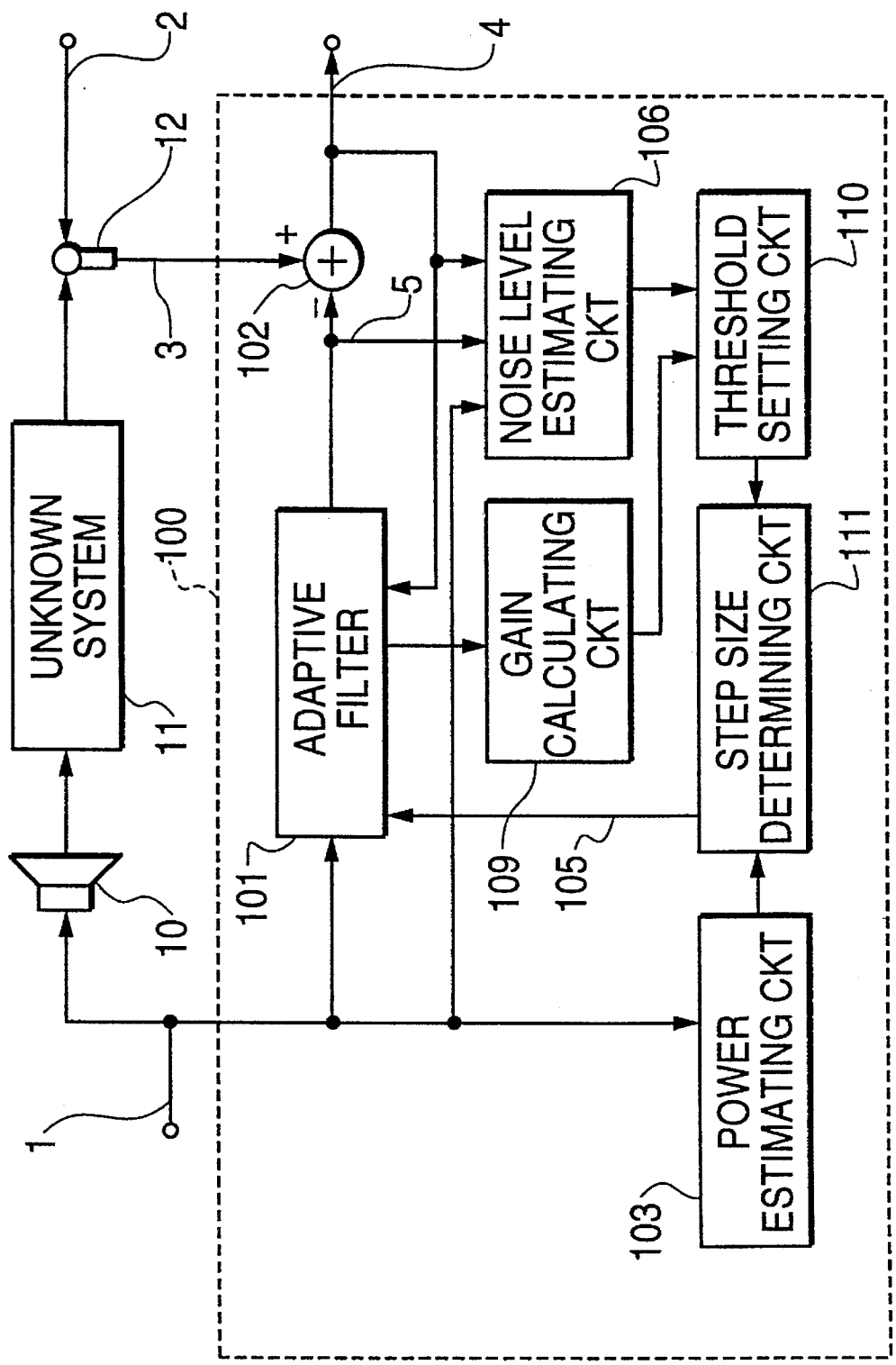
FIG. 17 is a block diagram of an echo canceller as a system identification apparatus according to a third embodiment of the present invention.

FIG. 17 shows in block form an echo canceller 100 according to a third embodiment of the present invention. A reference input signal 1 is converted by a loudspeaker 10 into an acoustic signal which is propagated through an acoustic path 11 as an unknown system and reaches, as an acoustic echo, a microphone 12. The microphone 12 converts the acoustic echo, with noise 2 added thereto, into an electric signal as an observed signal 3. An adaptive filter 101 effects a convolutional calculation on the reference input signal 1 and a filter coefficient, and supplies the result as an output signal 5 to a subtractor 102. The subtractor 102 subtracts the output signal 5 from the observed signal 3, and produces a resultant error signal 4 as an output signal from the echo canceller 100, which is supplied to the adaptive filter 101. A power estimating circuit 103 estimates the power $P_x(t)$ of the reference input signal 1, and supplies the estimated power to a step size determining circuit 111. A noise level estimating circuit 106 estimates the level of the noise 2 mixed in the observed signal 3 based on the reference input signal 1, the error signal 4, and the output signal 5 from the adaptive filter 101, and supplies the estimated level to a threshold setting circuit 110. A gain estimating circuit 109 estimates the gain of the unknown system using the filter coefficient of the adaptive filter 101, and supplies the estimated gain to the threshold setting circuit 110. The threshold setting circuit 110 establishes a first threshold $P_{th}$ based on the noise level and the gain of the unknown system 11, and supplies the first threshold $P_{th}$ to the step size determining circuit 110. The step size determining circuit 111 determines a step size 105 based on the power of the reference input signal 1 and the first threshold $P_{th}$, and supplies the determined step size 105 to the adaptive filter 101. The adaptive filter 101 corrects the filter coefficients in order to minimize the error signal 4, using the reference input signal 1, the error signal 4, and the step size 105.

The estimated value of the gain, indicated by $G_h(t)$, of the unknown system 11 may be the square sum of filter coefficients represented by:

$$G_h(t) = \sum_{i=0}^{N=1} w_i^2(t) \qquad (23)$$

or the absolute sum of filter coefficients represented by:

$$G_h(t) = \sum_{i=0}^{N=1} |w_i(t)| \qquad (24)$$

Alternatively, the estimated value of the gain $G_h(t)$ may be the maximum absolute value $|w_i(t)|$ of the filter coefficient.

The first threshold $P_{th}$ may be represented by any function of the noise level $P_n(t)$ and the gain $G_h(t)$ of the unknown system 11. Such a function should preferably monotonously increase when the noise level $P_n(t)$ increases, and monotonously decrease when the gain $G_h(t)$ increases. The function may be expressed by:

$$P_{th} = \alpha \frac{P_n(t)}{G_h(t)} \qquad (25)$$

where $\alpha$ is a positive constant. Using a positive constant $G_0$, the function may be expressed by:

$$P_{th} = \alpha \frac{P_n(t)}{G_h(t) + G_0} \qquad (26)$$

Figure 18:
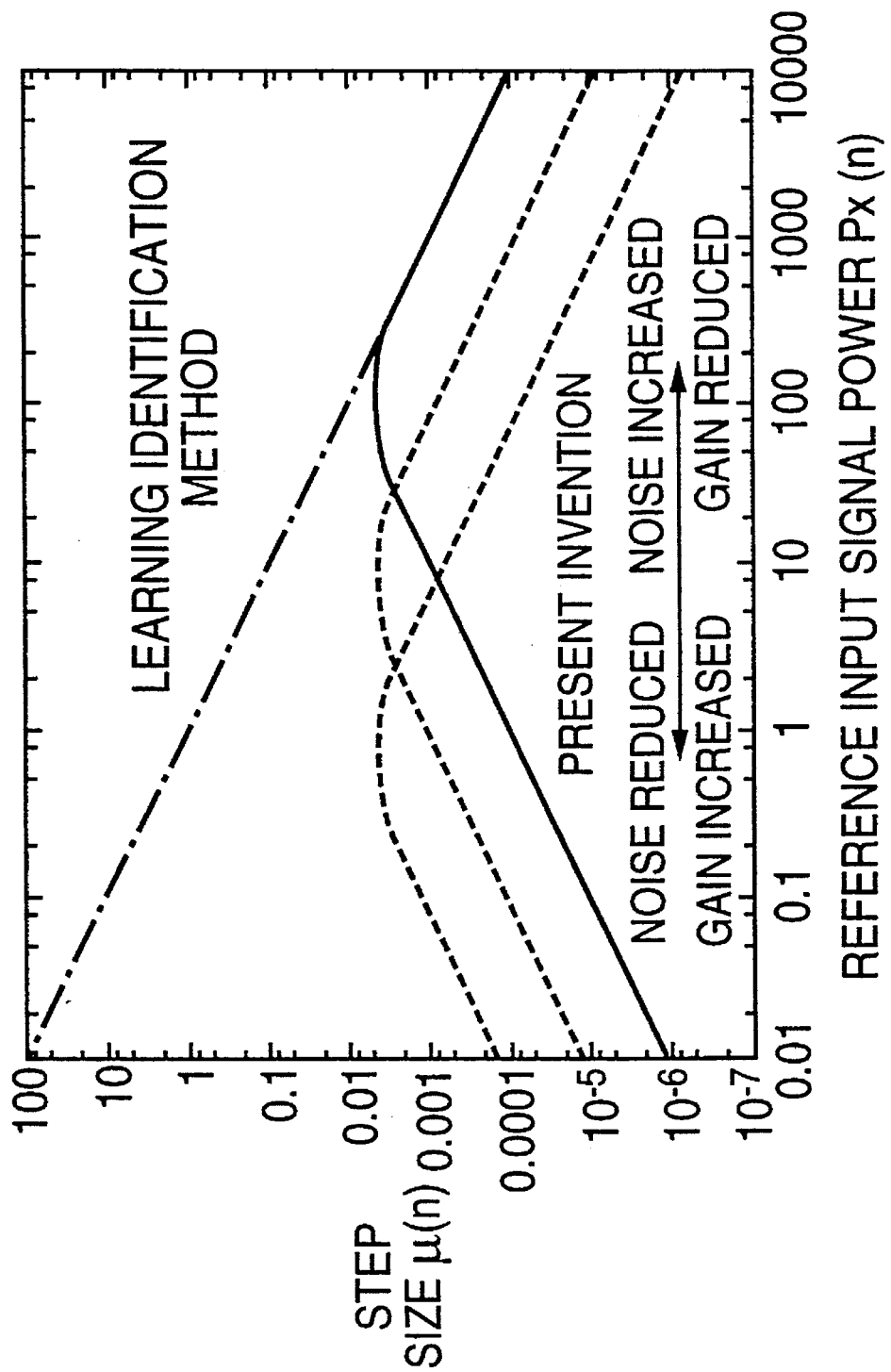
FIG. 18 is a graph showing a step size used in the system identification apparatus according to the third embodiment.

The step size $\mu(t)$ may be determined in the same manner as with the second embodiment described above. FIG. 18 shows such step sizes $\mu(t)$ by way of example. The reference input signal power $P_x(t)$ at which the step size $\mu(t)$ is maximum increases as the noise level $P_n(t)$ increases, and decreases as the gain $G_h(t)$ of the unknown system 11 increases.

Figure 19:
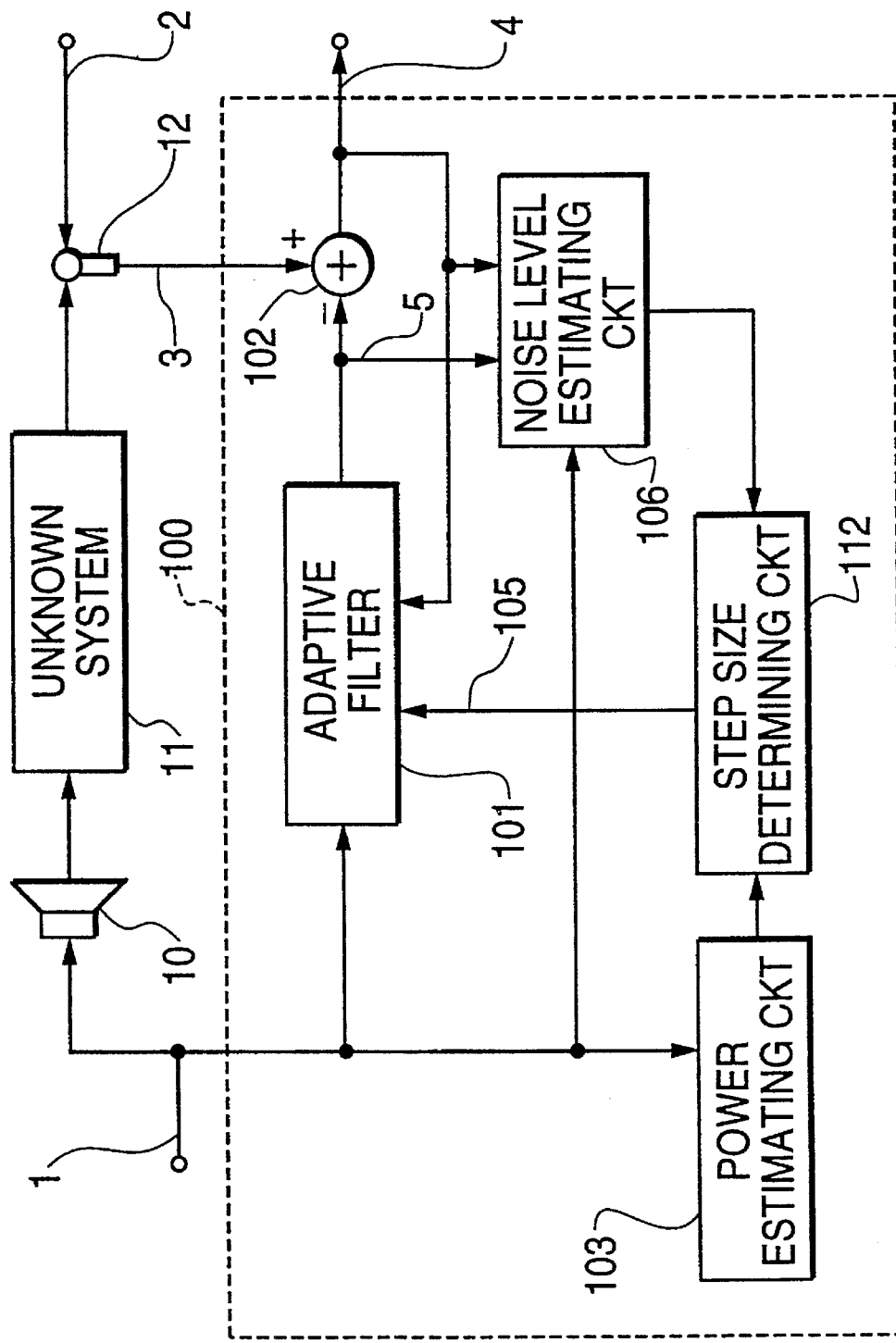
FIG. 19 is a block diagram of an echo canceller as a system identification apparatus according to a fourth embodiment of the present invention.

FIG. 19 shows in block form an echo canceller 100 according to a fourth embodiment of the present invention. A reference input signal 1 is converted by a loudspeaker 10 into an acoustic signal which is propagated through an acoustic path 11 as an unknown system and reaches, as an acoustic echo, a microphone 12. The microphone 12 converts the acoustic echo, with noise 2 added thereto, into an electric signal as an observed signal 3. An adaptive filter 101 effects a convolutional calculation on the reference input signal 1 and filter coefficients, and supplies the result as an output signal 5 to a subtractor 102. The subtractor 102 subtracts the output signal 5 from the observed signal 3, and produces a resultant error signal 4 as an output signal from the echo canceller 100, which is supplied to the adaptive filter 101. A power estimating circuit 103 estimates the power $P_x(t)$ of the reference input signal 1, and supplies the estimated power to a step size determining circuit 112. A noise level estimating circuit 106 estimates the level of the noise 2 mixed in the observed signal 3 based on the reference input signal 1, the error signal 4, and the output signal 5 from the adaptive filter 101, and supplies the estimated level to the step size determining circuit 112.

The step size determining circuit 112 determines a step size 105 based on the power of the reference input signal 1 and the noise level, and supplies the determined step size 105 to the adaptive filter 101. The adaptive filter 101 corrects the filter coefficients in order to minimize the error signal 4, using the reference input signal 1, the error signal 4, and the step size 105.

In determining the step size $\mu(t)$, the step size determining circuit 112 varies a first threshold $P_{th}$ and the maximum value $\mu_{max}$ of the step size $\mu(t)$ depending on the noise level $P_n(t)$. The first threshold $P_{th}$ should preferably be represented by a function which monotonously increases as the noise level $P_n(t)$ increases, and the maximum value $\mu_{max}$ of the step size $\mu(t)$ should preferably be represented by a function which monotonously decreases as the noise level $P_n(t)$ increases. Such a process of determining a step size may be based on the combination of the step size $\mu(t)$ expressed by the equation (8) and the threshold $P_{th}$ expressed by the equation (19). In such a case, the maximum value $\mu_{max}$ of the step size $\mu(t)$ is represented by:

$$\mu_{max} = \frac{\mu_0}{2\alpha P_n(t)} \qquad (27)$$

The combination of the step size $\mu(t)$ expressed by the equations (10)–(12) and the threshold $P_{th}$ expressed by the equation (19) may also be employed, with the maximum value $\mu_{max}$ of the step size $\mu(t)$ being represented by:

$$\mu_{max} = \frac{\mu_0}{\alpha P_n(t)} \qquad (28)$$

Figure 20:
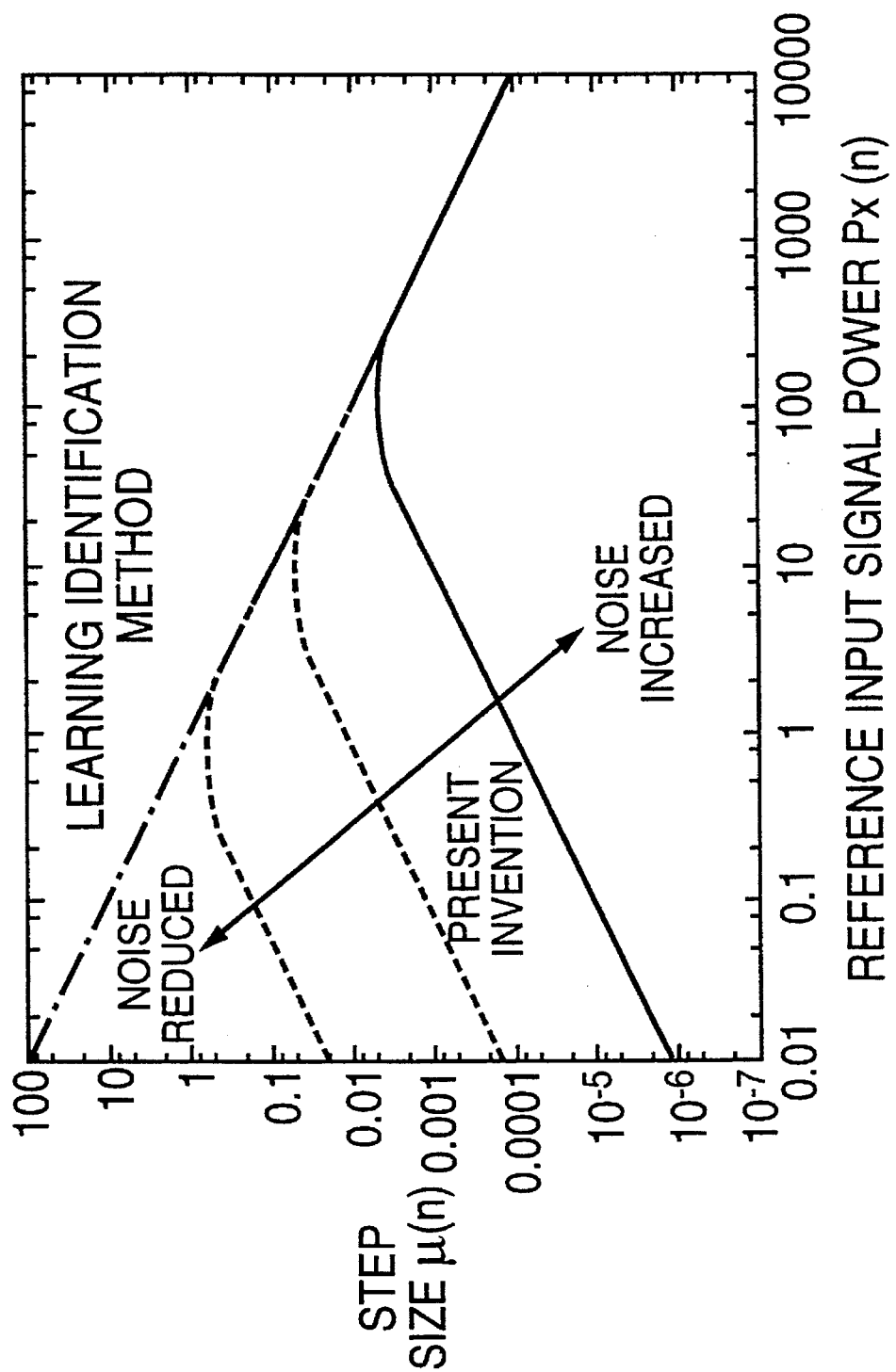
FIG. 20 is a graph showing a step size used in the system identification apparatus according to the fourth embodiment.

FIG. 20 shows such step sizes $\mu(t)$ by way of example. As the noise level $P_n(t)$ increases, the reference input signal power $P_x(t)$ at which the step size $\mu(t)$ is maximum increases, and the maximum value $\mu_{max}$ of the step size $\mu(t)$ decreases.

Figure 21:
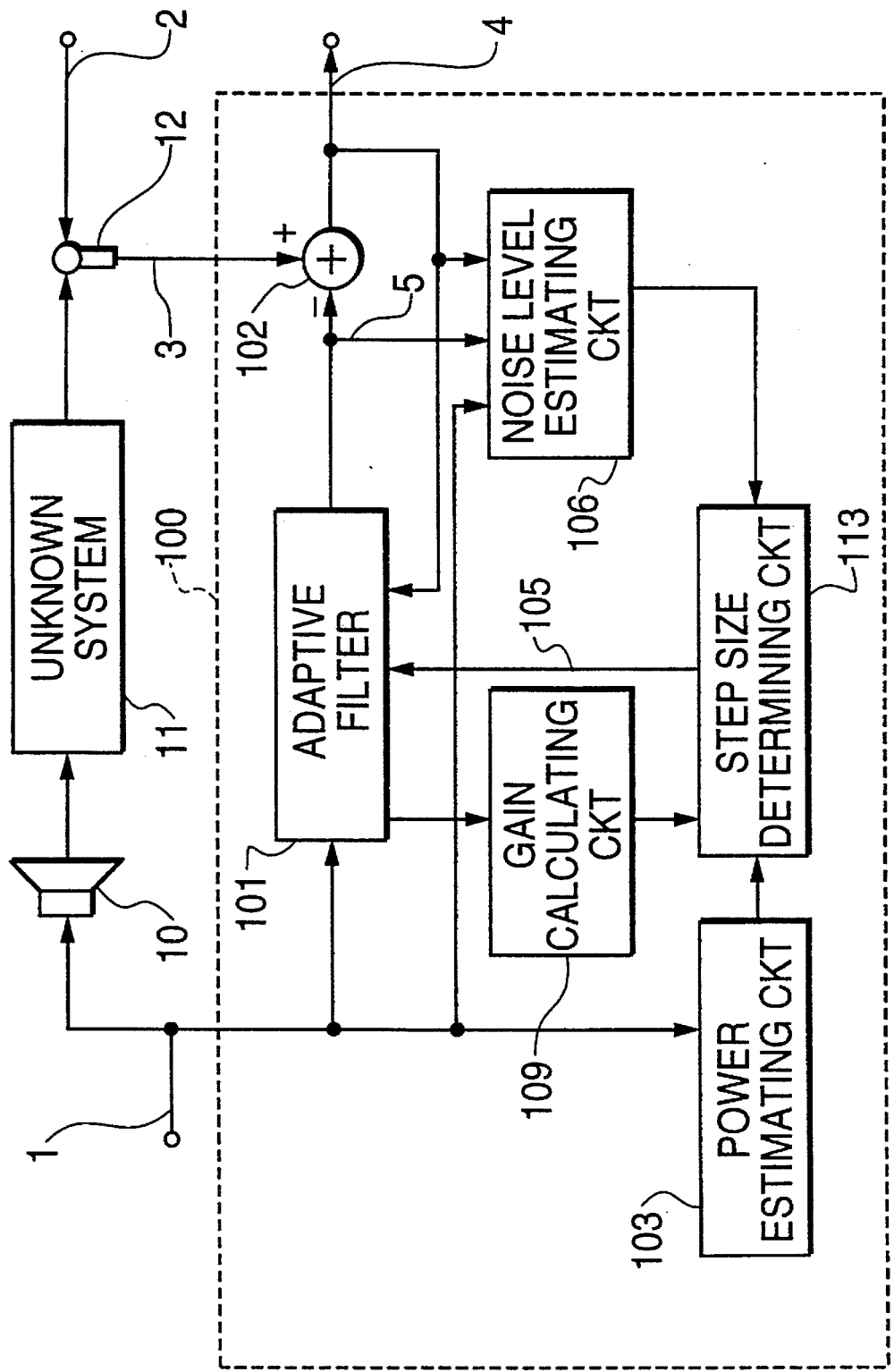
FIG. 21 is a block diagram of an echo canceller as a system identification apparatus according to a fifth embodiment of the present invention.

FIG. 21 shows in block form an echo canceller 100 according to a fifth embodiment of the present invention. A reference input signal 1 is converted by a loudspeaker 10 into an acoustic signal which is propagated through an acoustic path 11 as an unknown system and reaches, as an acoustic echo, a microphone 12. The microphone 12 converts the acoustic echo, with noise 2 added thereto, into an electric signal as an observed signal 3. An adaptive filter 101 effects a convolutional calculation on the reference input signal 1 and filter coefficients, and supplies the result as an output signal 5 to a subtractor 102. The subtractor 102 subtracts the output signal 5 from the observed signal 3, and produces a resultant error signal 4 as an output signal from the echo canceller 100, which is supplied to the adaptive filter 101. A power estimating circuit 103 estimates the power $P_x(t)$ of the reference input signal 1, and supplies the estimated power to a step size determining circuit 113. A noise level estimating circuit 106 estimates the level of the noise 2 mixed in the observed signal 3 based on the reference input signal 1, the error signal 4, and the output signal 5 from the adaptive filter 101, and supplies the estimated level to a step size determining circuit 113.

A gain estimating circuit 109 estimates the gain of the unknown system using the filter coefficient of the adaptive filter 101, and supplies the estimated gain to the step size determining circuit 113. The step size determining circuit 113 determines a step size 105 based on the power of the reference input signal 1, the noise level, and the gain of the unknown system 11, and supplies the determined step size 105 to the adaptive filter 101. The adaptive filter 101 corrects the filter coefficients in order to minimize the error signal 4, using the reference input signal 1, the error signal 4, and the step size 105.

In determining the step size $\mu(t)$, the step size determining circuit 113 varies a first threshold $P_{th}$ and the maximum value $\mu_{max}$ of the step size $\mu(t)$ depending on the noise level $P_n(t)$ and the gain of the unknown system 11. The first threshold $P_{th}$ should preferably be represented by a function which monotonously increases as the noise level $P_n(t)$ increases and monotonously decreases as the gain $G_h(t)$ of the unknown system 11 increases, and the maximum value $\mu_{max}$ of the step size $\mu(t)$ should preferably be represented by a function which monotonously decreases as the noise level $P_n(t)$ increases and monotonously increases as the gain $G_h(t)$ of the unknown system 11 increases. Such a process of determining a step size may be based on the combination of the step size $\mu(t)$ expressed by the equation (8) and the threshold $P_{th}$ expressed by the equation (26). In such a case, the maximum value $\mu_{max}$ of the step size $\mu(t)$ is represented by:

$$\mu_{max} = \frac{\mu_0 G_h(t)}{2\alpha P_n(t)} \quad (29)$$

The combination of the step size $\mu(t)$ expressed by the equations (10)–(12) and the threshold $P_{th}$ expressed by the equation (26) may also be employed, with the maximum value $\mu_{max}$ of the step size $\mu(t)$ being represented by:

$$\mu_{max} = \frac{\mu_0 G_h(t)}{\alpha P_n(t)} \quad (30)$$

Figure 22:
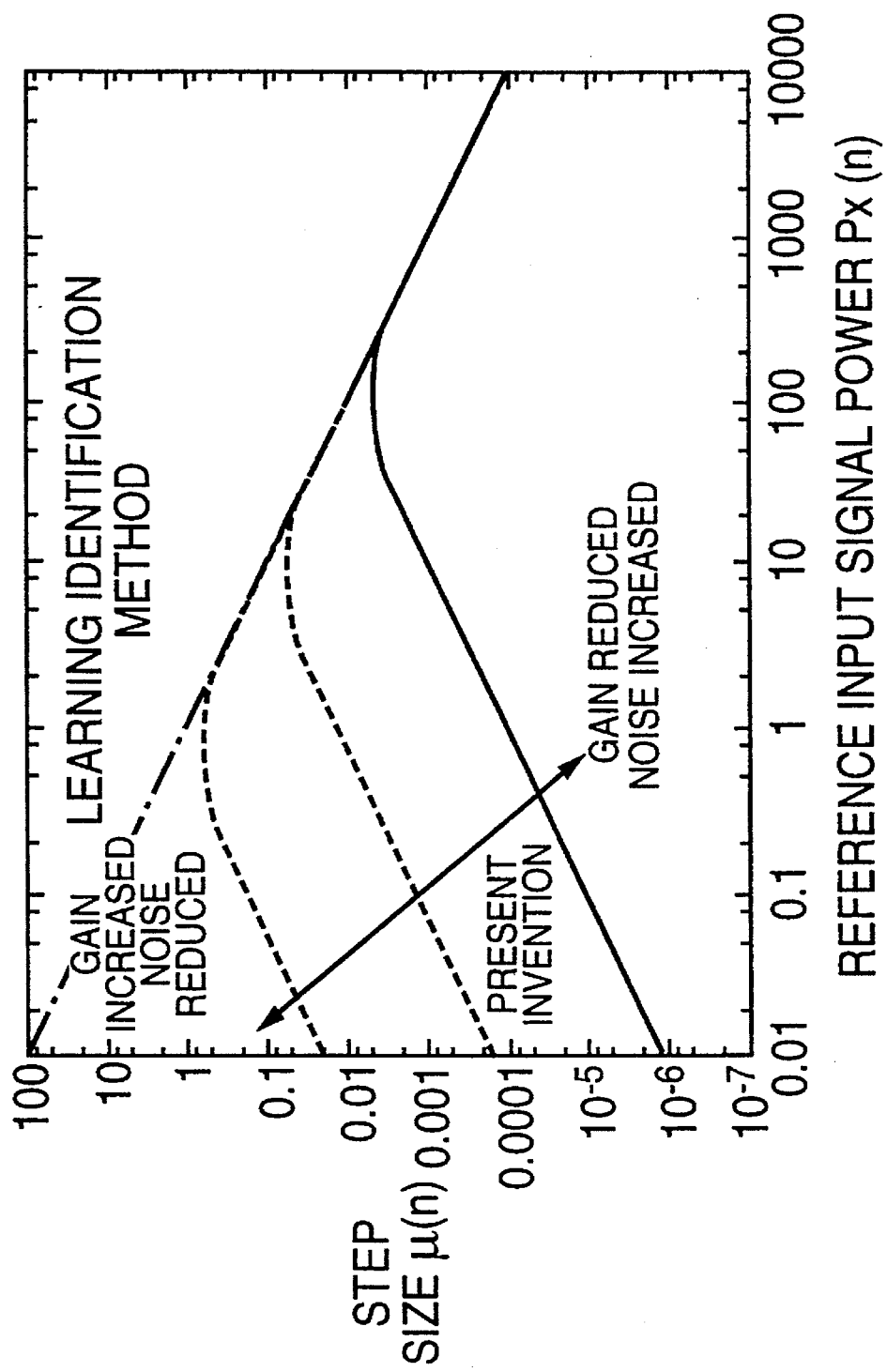
FIG. 22 is a graph showing a step size used in the system identification apparatus according to the fifth embodiment.

FIG. 22 shows such step sizes $\mu(t)$ by way of example. The reference input signal power $P_x(t)$ at which the step size $\mu(t)$ is maximum increases as the noise level $P_n(t)$ increases, and decreases as the gain $G_h(t)$ of the unknown system 11 increases. The maximum value $\mu_{max}$ of the step size $\mu(t)$ decreases as the noise level $P_n(t)$ increases, and increases as the gain $G_h(t)$ of the unknown system 11 increases.

Since the method of and the apparatus for identifying a system according to the present invention, as described above, vary the step size depending on the power of the reference input signal, the noise level, etc., the filter coefficients can be updated properly in an environment in which noise is mixed in the observed signal.

Although certain preferred embodiments of the present invention have been shown and described in detail, it should be understood that various changes and modifications may be made therein without departing from the scope of the appended claims.

What is claimed is:

1. A method of identifying a system with an adaptive filter, comprising the steps of:

calculating an error signal by subtracting an output signal produced by processing a reference input signal with an adaptive filter from an observed signal composed of a mixture of an output signal from an unknown system and noise;

estimating characteristics of the unknown system by correcting coefficients of said adaptive filter in order to minimize the error signal using at least said error signal, said reference input signal, and a step size; and producing a value as said step size by estimating the power of said reference input signal and processing the estimated power of said reference input signal according to a function which has a maximum value when the power of said reference input signal is equal to a first threshold, monotonically increases when the power of said reference input signal is smaller than said first threshold, and monotonically decreases when the power of said reference input signal is greater than said first threshold, further comprising the steps of estimating the level of noise mixed in the observed signal using said error signal and at least one of an output signal from said adaptive filter and said reference input signal, and controlling said first threshold depending on the level of noise, thereby determining said first threshold.

2. A method of identifying a system with an adaptive filter, comprising the steps of:

calculating an error signal by subtracting an output signal produced by processing a reference input signal with an adaptive filter from an observed signal composed of a mixture of an output signal from an unknown system and noise;

estimating characteristics of the unknown system by correcting coefficients of said adaptive filter in order to minimize the error signal using at least said error signal, said reference input signal, and a step size; and producing a value as said step size by estimating the power of said reference input signal and processing the estimated power of said reference input signal according to a function which has a maximum value when the power of said reference input signal is equal to a first threshold, monotonically increases when the power of said reference input signal is smaller than said first threshold, and monotonically decreases when the power of said reference input signal is greater than said first threshold, further comprising the steps of estimating the level of noise mixed in the observed signal using said error signal and at least one of an output signal from said adaptive filter and said reference input signal, estimating the gain of said unknown system using the coefficients of said adaptive filter, and controlling said first threshold depending on the level of noise and the gain of said unknown system, thereby determining said first threshold.

3. A method of identifying a system with an adaptive filter, comprising the steps of:

calculating an error signal by subtracting an output signal produced by processing a reference input signal with an adaptive filter from an observed signal composed of a mixture of an output signal from an unknown system and noise;

estimating characteristics of the unknown system by correcting coefficients of said adaptive filter in order to minimize the error signal using at least said error signal, said reference input signal, and a step size; and producing a value as said step size by estimating the power of said reference input signal and processing the estimated power of said reference input signal according to a function which has a maximum value when the power of said reference input signal is equal to a first threshold, monotonically increases when the power of said reference input signal is smaller than said first threshold, and monotonically decreases when the power of said reference input signal is greater than said first threshold, further comprising the steps of estimating the level of noise mixed in the observed signal using said error signal and at least one of an output signal from said adaptive filter and said reference input signal, and controlling said first threshold and a maximum value of said step size depending on the level of noise, thereby determining said first threshold and the maximum value of said step size.

4. A method of identifying a system with an adaptive filter, comprising the steps of:

calculating an error signal by subtracting an output signal produced by processing a reference input signal with an adaptive filter from an observed signal composed of a mixture of an output signal from an unknown system and noise;

estimating characteristics of the unknown system by correcting coefficients of said adaptive filter in order to minimize the error signal using at least said error signal, said reference input signal, and a step size; and producing a value as said step size by estimating the power of said reference input signal and processing the estimated power of said reference input signal according to a function which has a maximum value when the power of said reference input signal is equal to a first threshold, monotonically increases when the power of said reference input signal is smaller than said first threshold, and monotonically decreases when the power of said reference input signal is greater than said first threshold, further comprising the steps of estimating the level of noise mixed in the observed signal using said error signal and at least one of an output signal from said adaptive filter and said reference input signal, estimating the gain of said unknown system using the coefficients of said adaptive filter, and controlling said first threshold and a maximum value of said step size depending on the level of noise and the gain of said unknown system, thereby determining said first threshold and the maximum value of said step size.

5. A method according to claim 1, further comprising the steps of updating an estimated value of the level of noise only when the output signal from said adaptive filter has a level smaller than a second threshold, and otherwise holding a preceding estimated value of the level of noise, thereby estimating said level of noise.

6. A method according to claim 2, further comprising the steps of updating an estimated value of the level of noise only when the output signal from said adaptive filter has a level smaller than a second threshold, and otherwise holding a preceding estimated value of the level of noise, thereby estimating said level of noise.

7. A method according to claim 3, further comprising the steps of updating an estimated value of the level of noise only when the output signal from said adaptive filter has a level smaller than a second threshold, and otherwise holding a preceding estimated value of the level of noise, thereby estimating said level of noise.

8. A method according to claim 4, further comprising the steps of updating an estimated value of the level of noise only when the output signal from said adaptive filter has a level smaller than a second threshold, and otherwise holding a preceding estimated value of the level of noise, thereby estimating said level of noise.

9. A method according to claim 5, further comprising the step of controlling said second threshold depending on the level of said error signal, thereby estimating said level of noise.

10. A method according to claim 6, further comprising the step of controlling said second threshold depending on the level of said error signal, thereby estimating said level of noise.

11. A method according to claim 7, further comprising the step of controlling said second threshold depending on the level of said error signal, thereby estimating said level of noise.

12. A method according to claim 8, further comprising the step of controlling said second threshold depending on the level of said error signal, thereby estimating said level of noise.

13. A method according to claim 1, further comprising the steps of updating an estimated value of the level of noise only when said reference input signal has a level smaller than a third threshold, and otherwise holding a preceding estimated value of the level of noise, thereby estimating said level of noise.

14. A method according to claim 2, further comprising the steps of updating an estimated value of the level of noise only when said reference input signal has a level smaller than a third threshold, and otherwise holding a preceding estimated value of the level of noise, thereby estimating said level of noise.

15. A method according to claim 3, further comprising the steps of updating an estimated value of the level of noise only when said reference input signal has a level smaller than a third threshold, and otherwise holding a preceding estimated value of the level of noise, thereby estimating said level of noise.

16. A method according to claim 4, further comprising the steps of updating an estimated value of the level of noise only when said reference input signal has a level smaller than a third threshold, and otherwise holding a preceding estimated value of the level of noise, thereby estimating said level of noise.

17. A method according to claim 13, further comprising the step of controlling said third threshold depending on the level of said error signal, thereby estimating said level of noise.

18. A method according to claim 14, further comprising the step of controlling said third threshold depending on the level of said error signal, thereby estimating said level of noise.

19. A method according to claim 15, further comprising the step of controlling said third threshold depending on the level of said error signal, thereby estimating said level of noise.

20. A method according to claim 16, further comprising the step of controlling said third threshold depending on the level of said error signal, thereby estimating said level of noise.

21. A method according to claim 1, further comprising the steps of adding the product of an estimated value of the level of noise and a first coefficient and the product of the level of the error signal and a second coefficient thereby to produce a new estimated value of the level of noise, and controlling said first coefficient and said second coefficient depending on the level of said error signal and the level of at least one of the output signal from said adaptive filter or said reference input signal, thereby estimating the level of noise.

22. A method according to claim 2, further comprising the steps of adding the product of an estimated value of the level of noise and a first coefficient and the product of the level of the error signal and a second coefficient thereby to produce a new estimated value of the level of noise, and controlling said first coefficient and said second coefficient depending on the level of said error signal and the level of at least one of the output signal from said adaptive filter or said reference input signal, thereby estimating the level of noise.

23. A method according to claim 3, further comprising the steps of adding the product of an estimated value of the level of noise and a first coefficient and the product of the level of the error signal and a second coefficient thereby to produce a new estimated value of the level of noise, and controlling said first coefficient and said second coefficient depending on the level of said error signal and the level of at least one of the output signal from said adaptive filter or said reference input signal, thereby estimating the level of noise.

24. A method according to claim 4, further comprising the steps of adding the product of an estimated value of the level of noise and a first coefficient and the product of the level of the error signal and a second coefficient thereby to produce a new estimated value of the level of noise, and controlling said first coefficient and said second coefficient depending on the level of said error signal and the level of at least one of the output signal from said adaptive filter or said reference input signal, thereby estimating the level of noise.

25. An apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of said adaptive filter based on said error signal, comprising:

an adaptive filter for producing an output signal using at least the reference input signal and filter coefficients thereof;

a subtractor for calculating an error signal by subtracting the output signal of the adaptive filter from an observed signal composed of a mixture of an output signal from the unknown system and noise, and supplying the error signal to said adaptive filter;

a power estimating circuit for estimating the power of the reference input signal;

a noise level estimating circuit for estimating the level of noise mixed in the observed signal using said error signal and at least one of the output signal from said adaptive filter or said reference input signal;

a threshold setting circuit for calculating a first threshold based on the estimated level of noise from said noise level estimating circuit; and a step size determining circuit for calculating a step size based on the estimated power from said power estimating circuit and said first threshold from said threshold setting circuit, and supplying the calculated step size to said adaptive filter;

the arrangement being such that said step size determining circuit generates a step size according to a function of the power of the reference input signal which monotonously increases if the power of the reference input signal is smaller than the first threshold and monotonously decreases if the power of the reference input signal is greater than the first threshold, and said adaptive filter corrects the filter coefficients thereof in order to minimize said error signal using at least said error signal, said reference input signal, and said step size, for thereby estimating the characteristics of the unknown system.

26. An apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of said adaptive filter based on said error signal, comprising:

an adaptive filter for producing an output signal using at least the reference input signal and filter coefficients thereof;

a subtractor for calculating an error signal by subtracting the output signal of the adaptive filter from an observed signal composed of a mixture of an output signal from the unknown system and noise, and supplying the error signal to said adaptive filter;

a power estimating circuit for estimating the power of the reference input signal;

a noise level estimating circuit for estimating the level of noise mixed in the observed signal using said error signal and at least one of the output signals from said adaptive filter and said reference input signal;

a gain calculating circuit for estimating the gain of the unknown system using the filter coefficient of said adaptive filter;

a threshold setting circuit for calculating a first threshold based on the estimated level of noise from said noise level estimating circuit and the estimated gain from said gain calculating circuit; and a step size determining circuit for calculating a step size based on the estimated power from said power estimating circuit and said first threshold from said threshold setting circuit, and supplying the calculated step size to said adaptive filter;

the arrangement being such that said step size determining circuit generates a step size according to a function of the power of the reference input signal which monotonously increases if the power of the reference input signal is smaller than the first threshold and monotonously decreases if the power of the reference input signal is greater than the first threshold, and said adaptive filter corrects the filter coefficients thereof in order to minimize said error signal using at least said error signal, said reference input signal, and said step size, for thereby estimating the characteristics of the unknown system.

27. An apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of said adaptive filter based on said error signal, comprising:

an adaptive filter for producing an output signal using at least the reference input signal and filter coefficients thereof;

a subtractor for calculating an error signal by subtracting the output signal of the adaptive filter from an observed signal composed of a mixture of an output signal from the unknown system and noise, and supplying the error signal to said adaptive filter;

a power estimating circuit for estimating the power of the reference input signal;

a noise level estimating circuit for estimating the level of noise mixed in the observed signal using said error signal and at least one of the output signal from said adaptive filter or said reference input signal; and a step size determining circuit for calculating a step size based on the estimated power from said power estimating circuit and the estimated level of noise from said noise level estimating circuit, and supplying the calculated step size to said adaptive filter;

the arrangement being such that said step size determining circuit establishes a first threshold and a maximum value of the step size based on the estimated level of noise, generates a step size according to a function of the power of the reference input signal which monotonously increases if the power of the reference input signal is smaller than said first threshold and monotonously decreases if the power of the reference input signal is greater than the first threshold, and said adaptive filter corrects the filter coefficients thereof in order to minimize said error signal using at least said error signal, said reference input signal, and said step size, for thereby estimating the characteristics of the unknown system.

28. An apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of said adaptive filter based on said error signal, comprising:

an adaptive filter for producing an output signal using at least the reference input signal and a filter coefficient thereof;

a subtractor for calculating an error signal by subtracting the output signal of the adaptive filter from an observed signal composed of a mixture of an output signal from the unknown system and noise, and supplying the error signal to said adaptive filter;

a power estimating circuit for estimating the power of the reference input signal;

a noise level estimating circuit for estimating the level of noise mixed in the observed signal using said error signal and at least one of the output signal from said adaptive filter or said reference input signal;

a gain calculating circuit for estimating the gain of the unknown system using the filter coefficient of said adaptive filter; and a step size determining circuit for calculating a step size based on the estimated power from said power estimating circuit, the estimated level of noise from said noise level estimating circuit, and the estimated gain from said gain estimating circuit, and supplying the calculated step size to said adaptive filter;

the arrangement being such that said step size determining circuit establishes a first threshold and a maximum value of the step size based on the estimated level of noise and the estimated gain of the unknown system, generates a step size according to a function of the power of the reference input signal which monotonously increases if the power of the reference input signal is smaller than said first threshold and monotonously decreases if the power of the reference input signal is greater than the first threshold, and said adaptive filter corrects the filter coefficients thereof in order to minimize said error signal using at least said error signal, said reference input signal, and said step size, for thereby estimating the characteristics of the unknown system.

29. An apparatus according to claim 25, wherein said noise level estimating circuit comprises:

an output level estimating circuit for estimating the level of the output signal from said adaptive filter;

a register for storing a second threshold;

a comparator for comparing the estimated level of the output signal from said adaptive filter with said second threshold; and a noise level calculating circuit for updating the estimated level of noise using said error signal only if said comparator determines that the estimated level of the output signal from said adaptive filter is smaller than said second threshold.

30. An apparatus according to claim 26, wherein said noise level estimating circuit comprises:

an output level estimating circuit for estimating the level of the output signal from said adaptive filter;

a register for storing a second threshold;

a comparator for comparing the estimated level of the output signal from said adaptive filter with said second threshold; and a noise level calculating circuit for updating the estimated level of noise using said error signal only if said comparator determines that the estimated level of the output signal from said adaptive filter is smaller than said second threshold.

31. An apparatus according to claim 27, wherein said noise level estimating circuit comprises:

an output level estimating circuit for estimating the level of the output signal from said adaptive filter;

a register for storing a second threshold;

a comparator for comparing the estimated level of the output signal from said adaptive filter with said second threshold; and a noise level calculating circuit for updating the estimated level of noise using said error signal only if said comparator determines that the estimated level of the output signal from said adaptive filter is smaller than said second threshold.

32. An apparatus according to claim 28, wherein said noise level estimating circuit comprises:

an output level estimating circuit for estimating the level of the output signal from said adaptive filter;

a register for storing a second threshold;

a comparator for comparing the estimated level of the output signal from said adaptive filter with said second threshold; and a noise level calculating circuit for updating the estimated level of noise using said error signal only if said comparator determines that the estimated level of the output signal from said adaptive filter is smaller than said second threshold.

33. An apparatus according to claim 29, wherein said register is replaced with a threshold generator for generating a threshold depending on said error signal which is supplied as an input signal thereto.

34. An apparatus according to claim 30, wherein said register is replaced with a threshold generator for generating a threshold depending on said error signal which is supplied as an input signal thereto.

35. An apparatus according to claim 31, wherein said register is replaced with a threshold generator for generating a threshold depending on said error signal which is supplied as an input signal thereto.

36. An apparatus according to claim 32, wherein said register is replaced with a threshold generator for generating a threshold depending on said error signal which is supplied as an input signal thereto.

37. An apparatus according to claim 29, wherein said output level estimating circuit is replaced with a reference input signal level estimating circuit for estimating the level of the reference input signal, and said register stores the third threshold.

38. An apparatus according to claim 30, wherein said output level estimating circuit is replaced with a reference input signal level estimating circuit for estimating the level of the reference input signal, and said register stores the third threshold.

39. An apparatus according to claim 31, wherein said output level estimating circuit is replaced with a reference input signal level estimating circuit for estimating the level of the reference input signal, and said register stores the third threshold.

40. An apparatus according to claim 32, wherein said output level estimating circuit is replaced with a reference input signal level estimating circuit for estimating the level of the reference input signal, and said register stores the third threshold.

41. An apparatus according to claim 37, wherein said register is replaced with a threshold generator for generating a threshold depending on said error signal which is supplied as an input signal thereto.

42. An apparatus according to claim 38, wherein said register is replaced with a threshold generator for generating a threshold depending on said error signal which is supplied as an input signal thereto.

43. An apparatus according to claim 39, wherein said register is replaced with a threshold generator for generating a threshold depending on said error signal which is supplied as an input signal thereto.

44. An apparatus according to claim 40, wherein said register is replaced with a threshold generator for generating a threshold depending on said error signal which is supplied as an input signal thereto.

45. An apparatus according to claim 25, wherein said noise level estimating circuit comprises:
- a register for storing the estimated level of noise;
- a first multiplier for multiplying the estimated level of noise stored in said register by a first coefficient;
- a nonlinear converter for nonlinearly converting said error signal into a converted signal;
- a second multiplier for multiplying the converted signal by a second coefficient;
- an adder for adding a product signal from said first multiplier and a product signal from said second multiplier, and storing a resultant sum signal in said register as the estimated level of noise; and
- a coefficient generator for establishing the first and second coefficients based on said error signal and at least one of the output signal from the adaptive filter and the reference signal.

46. An apparatus according to claim 26, wherein said noise level estimating circuit comprises:
- a register for storing the estimated level of noise;
- a first multiplier for multiplying the estimated level of noise stored in said register by a first coefficient;
- a nonlinear converter for nonlinearly converting said error signal into a converted signal;
- a second multiplier for multiplying the converted signal by a second coefficient;
- an adder for adding a product signal from said first multiplier and a product signal from said second multiplier, and storing a resultant sum signal in said register as the estimated level of noise; and
- a coefficient generator for establishing the first and second coefficients based on said error signal and at least one of the results of the output signal from the adaptive filter and the reference signal.

47. An apparatus according to claim 27, wherein said noise level estimating circuit comprises:
- a register for storing the estimated level of noise;
- a first multiplier for multiplying the estimated level of noise stored in said register by a first coefficient;
- a nonlinear converter for nonlinearly converting said error signal into a converted signal;
- a second multiplier for multiplying the converted signal by a second coefficient;
- an adder for adding a product signal from said first multiplier and a product signal from said second multiplier, and storing a resultant sum signal in said register as the estimated level of noise; and
- a coefficient generator for establishing the first and second coefficients based on said error signal and at least one of the output signal from the adaptive filter and the reference signal.

48. An apparatus according to claim 28, wherein said noise level estimating circuit comprises:
- a register for storing the estimated level of noise;
- a first multiplier for multiplying the estimated level of noise stored in said register by a first coefficient;
- a nonlinear converter for nonlinearly converting said error signal into a converted signal;
- a second multiplier for multiplying the converted signal by a second coefficient;
- an adder for adding a product signal from said first multiplier and a product signal from said second multiplier, and storing a resultant sum signal in said register as the estimated level of noise; and
- a coefficient generator for establishing the first and second coefficients based on said error signal and at least one of the output signal from the adaptive filter and the reference signal.

49. A method of identifying a system with an adaptive filter, comprising the steps of:
- calculating an error signal by subtracting an output signal produced by processing a reference input signal with an adaptive filter from an observed signal composed of a mixture of an output signal from an unknown system and noise;
- estimating characteristics of the unknown system by correcting coefficients of said adaptive filter in order to minimize the error signal using at least said error signal, said reference input signal, and a step size; and producing a value as said step size by estimating the power of said reference input signal and processing the estimated power of said reference input signal according to a function which has a maximum value when the power of said reference input signal is equal to a first threshold, has a direct proportional relationship with the power of said reference input signal when the power of said reference input signal is smaller than said first threshold, and has an inverse proportional relationship with the power of said reference input signal when the power of said reference input signal is greater than said first threshold.

50. An apparatus for identifying a system by calculating an error signal by subtracting an output signal produced by processing a reference input signal with an adaptive filter from an observed signal composed of a mixture of an output signal from the unknown system and noise, and estimating characteristics of the unknown system by correcting coefficients of said adaptive filter based on said error signal, comprising:

an adaptive filter for producing an output signal using at least the reference input signal and filter coefficients thereof;

a subtractor for calculating an error signal by subtracting the output signal of the adaptive filter from an observed signal composed of a mixture of an output signal from the unknown system and noise, and supplying the error signal to said adaptive filter;

a power estimating circuit for estimating the power of the reference input signal; and a step size determining circuit for calculating a step size based on the estimated power from said power estimating circuit and supplying the calculated step size to said adaptive filter;

the arrangement being such that said step size determining circuit generates a step size according to a function of the power of the reference input signal, wherein the step size has a direct proportional relationship to the power of the reference input signal if the power of the reference input signal is smaller than a first threshold and has an inverse proportional relationship to the power of the reference input signal if the power of the reference input signal is greater than the first threshold, and said adaptive filter corrects the filter coefficients thereof in order to minimize said error signal using at least said error signal, said reference input signal, and said step size, for thereby estimating the characteristics of the unknown system.

* * * * *